United States Patent
Lee et al.

(10) Patent No.: US 10,680,008 B2
(45) Date of Patent: Jun. 9, 2020

(54) METHODS OF MANUFACTURING SEMICONDUCTOR DEVICES

(71) Applicant: Samsung Electronics Co., Ltd., Suwon-si, Gyeonggi-do (KR)

(72) Inventors: Keun Lee, Seongnam-si (KR); Jeong Gil Lee, Hwaseong-si (KR); Do Hyung Kim, Seongnam-si (KR); Sung Nam Lyu, Hwaseong-si (KR); Hyun Seok Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 64 days.

(21) Appl. No.: 16/000,984

(22) Filed: Jun. 6, 2018

(65) Prior Publication Data
US 2019/0148397 A1    May 16, 2019

(30) Foreign Application Priority Data
Nov. 16, 2017    (KR) .................. 10-2017-0152894

(51) Int. Cl.
*H01L 27/11582* (2017.01)
*H01L 27/1157* (2017.01)
*H01L 21/768* (2006.01)
*H01L 23/532* (2006.01)
(Continued)

(52) U.S. Cl.
CPC .. *H01L 27/11582* (2013.01); *H01L 21/02271* (2013.01); *H01L 21/76865* (2013.01); *H01L 21/76876* (2013.01); *H01L 21/76877* (2013.01); *H01L 23/53257* (2013.01); *H01L 27/1157* (2013.01); *H01L 29/40117* (2019.08); *H01L 21/0245* (2013.01); *H01L 21/0262* (2013.01);
(Continued)

(58) Field of Classification Search
CPC ......... H01L 27/11582; H01L 21/76876; H01L 21/02271; H01L 21/76877; H01L 21/76865; H01L 27/1157; H01L 23/53257
USPC ........................................................ 438/791
See application file for complete search history.

(56) References Cited

U.S. PATENT DOCUMENTS

| | | |
|---|---|---|
| 9,536,745 B2 | 1/2017 | Narushima et al. |
| 9,601,339 B2 | 3/2017 | Fu et al. |
| 9,640,404 B2 | 5/2017 | Suzuki et al. |

(Continued)

FOREIGN PATENT DOCUMENTS

JP    2009-044106    2/2009

*Primary Examiner* — Karen Kusumakar
*Assistant Examiner* — Adam S Bowen
(74) *Attorney, Agent, or Firm* — Myers Bigel, P.A.

(57) ABSTRACT

A method of manufacturing a semiconductor device includes alternately stacking sacrificial layers and interlayer insulating layers on a substrate, to form a stack structure; forming channels penetrating through the stack structure; forming separation regions penetrating through the stack structure; forming lateral openings by removing the sacrificial layers through the separation regions; and forming gate electrodes in the lateral openings. Forming the gate electrodes may include forming a nucleation layer in the lateral openings by supplying a source gas and a first reaction gas, and forming a bulk layer on the nucleation layer to fill the lateral openings by supplying the source gas and a second reaction gas, different from the first reaction gas. The first reaction gas may be supplied from a first reaction gas source, stored in a gas charging unit, and supplied from the gas charging unit.

20 Claims, 23 Drawing Sheets

(51) Int. Cl.
*H01L 21/02* (2006.01)
*H01L 21/28* (2006.01)

(52) U.S. Cl.
CPC .. *H01L 21/02532* (2013.01); *H01L 21/02579* (2013.01)

(56) References Cited

U.S. PATENT DOCUMENTS

| | | | |
|---|---|---|---|
| 2009/0004848 A1* | 1/2009 | Kim | H01L 21/2855 438/644 |
| 2010/0244260 A1* | 9/2010 | Hinomura | H01L 21/76846 257/751 |
| 2014/0106577 A1 | 4/2014 | Tonegawa et al. | |
| 2014/0137799 A1 | 5/2014 | Jo et al. | |
| 2014/0353734 A1* | 12/2014 | Xie | H01L 21/283 257/288 |
| 2016/0343612 A1 | 11/2016 | Wang et al. | |
| 2017/0062472 A1 | 3/2017 | Park et al. | |
| 2017/0125538 A1 | 5/2017 | Sharangpani et al. | |
| 2017/0373197 A1* | 12/2017 | Sharangpani | H01L 27/11565 |
| 2018/0076032 A1* | 3/2018 | Wang | C23C 16/342 |

\* cited by examiner

METHODS OF MANUFACTURING SEMICONDUCTOR DEVICES

CROSS-REFERENCE TO RELATED APPLICATION

This U.S. nonprovisional patent application claims priority under 35 U.S.C. § 119 to Korean Patent Application No. 10-2017-0152894, filed on Nov. 16, 2017 in the Korean Intellectual Property Office, the disclosure of which is incorporated herein by reference in its entirety.

BACKGROUND

1. Technical Field

The present disclosure relates to methods of manufacturing semiconductor devices.

2. Description of Related Art

While semiconductor devices may be used to process high capacity data, the physical dimensions or volumes thereof have gradually been reduced. Thus, it is desirable to increase the integration of semiconductor elements constituting such semiconductor devices. Accordingly, in some methods of improving the degree of integration of a semiconductor device, semiconductor devices having three-dimensional transistor structures, for example, vertical transistor structures, rather than existing planar transistor structures, have been proposed.

SUMMARY

An aspect of the present disclosure is to provide a method of manufacturing a semiconductor device, in which a semiconductor device having improved reliability may be produced.

According to an aspect of the present disclosure, a method of manufacturing a semiconductor device may include alternately stacking sacrificial layers and interlayer insulating layers on a substrate, to form a stack structure; forming channels penetrating through the stack structure; forming separation regions penetrating through the stack structure; forming lateral openings by removing the sacrificial layers through the separation regions; and forming gate electrodes in the lateral openings. Forming the gate electrodes may include forming a nucleation layer in the lateral openings by supplying a source gas and a first reaction gas, and forming a bulk layer on the nucleation layer to fill the lateral openings by supplying the source gas and a second reaction gas, different from the first reaction gas. The first reaction gas may be supplied from a first reaction gas source, to be stored in a gas charging unit, and to be supplied from the gas charging unit.

According to an aspect of the present disclosure, a method may include alternately stacking sacrificial layers and interlayer insulating layers on a substrate to form a stack structure; forming channels in the stack structure; forming separation regions in the stack structure; forming lateral openings by removing the sacrificial layers through the separation regions; and forming gate electrodes in the lateral openings. Forming the gate electrodes may include forming a nucleation layer in the lateral openings; forming a first bulk layer on the nucleation layer in the lateral openings; forming a second bulk layer on the first bulk layer, wherein the second bulk layer has a specific resistivity higher than a specific resistivity of the first bulk layer, and forming a third bulk layer on the second bulk layer, outside of the lateral openings in the separation regions.

According to an aspect of the present disclosure, a method of manufacturing a semiconductor device may include forming a stack structure by alternately stacking sacrificial layers and interlayer insulating layers on a substrate, forming channels penetrating through the stack structure, forming lateral openings by removing the sacrificial layers, and forming gate electrodes including a nucleation layer and a bulk layer, in the lateral openings. The nucleation layer and the bulk layer may be formed using different reaction gases, and may include impurities having different concentrations.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the inventive concepts disclosed in the present application will be described with reference to the accompanying drawings.

Figure 1:
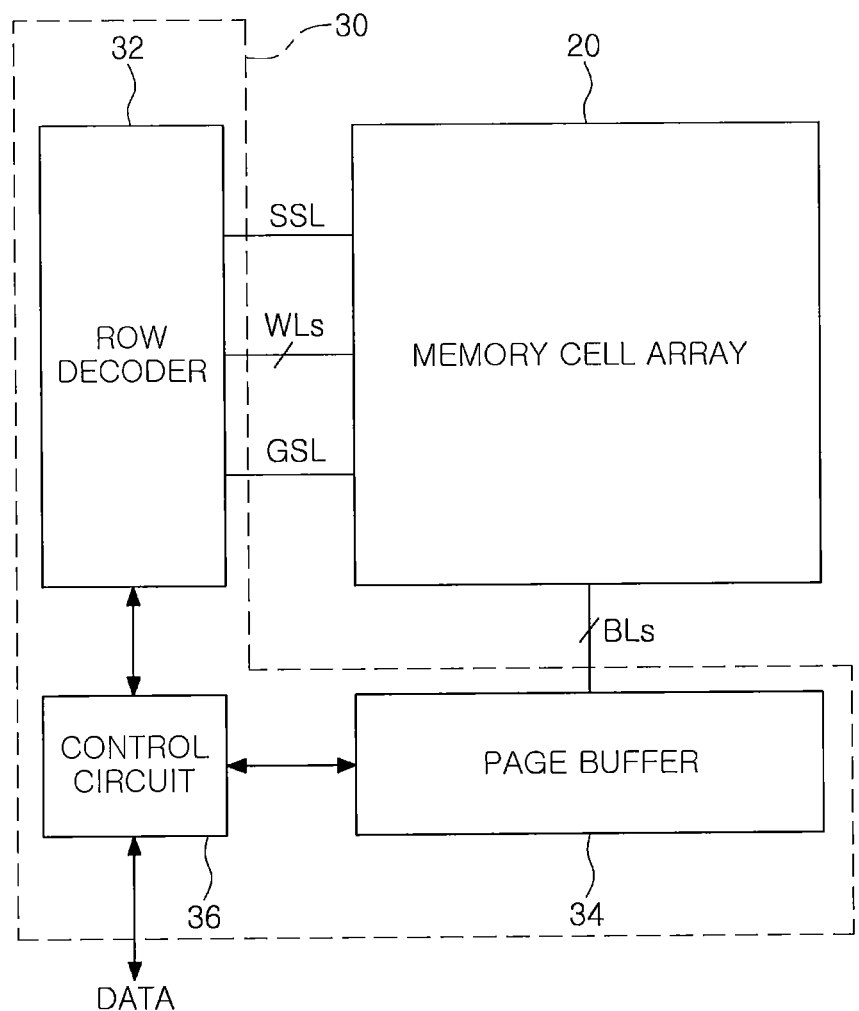
FIG. 1 is a schematic block diagram of a semiconductor device according to aspects of the present disclosure.

FIG. 1 is a schematic block diagram of a semiconductor device according to aspects of the present disclosure.

With reference to FIG. 1, a semiconductor device 10 may include a memory cell array 20 and a control logic 30.

The memory cell array 20 may include a plurality of memory blocks, and each of the memory blocks may include a plurality of memory cells. The plurality of memory cells may be connected to a row decoder 32 via a string select line SSL, a plurality of word lines WLs and a ground select line GSL, and may be connected to a page buffer 34 via bit lines BLs. In some embodiments, a plurality of memory cells arranged in a single row may be connected to a single word line WL, and a plurality of memory cells arranged in a single column may be connected to a single bit line BL.

The control logic 30 may include the row decoder 32, the page buffer 34, and a control circuit 36.

The row decoder 32 may decode an input address to generate and transmit driving signals for the word line WLs. The row decoder 32 may respectively provide a word line voltage generated from a voltage generating circuit in the control circuit 36, to a selected word line WL and unselected word lines WLs, in response to control of the control circuit 36.

The page buffer 34 may be connected to the memory cell array 20 via the bit lines BLs to read information stored in the memory cells. The page buffer 34 may temporarily store data to be stored in the memory cells or may sense data stored in the memory cells, according to an operating mode. The page buffer 34 may include a column decoder and a sense amplifier. The column decoder may selectively activate the bit lines BLs of the memory cell array 20, and the sense amplifier may sense a voltage of the bit line BL selected by the column decoder during a reading operation to read data stored in the selected memory cell.

The control circuit 36 may control operations of the row decoder 32 and the page buffer 34. The control circuit 36 may receive an externally transmitted control signal and an external voltage, and may operate in response to the received control signal. The control circuit 36 may include a voltage generating circuit generating voltages required for internal operations, for example, a program voltage, a read voltage, an erase voltage, and the like, using an external voltage. The control circuit 36 may control a reading operation, a writing operation and/or an erasing operation in response to the control signals. In addition, the control circuit 36 may include an input/output circuit. The input/output circuit may receive data DATA and transmit the data DATA to the page buffer 34, during program operations, and may output the data DATA received from the page buffer externally, during a reading operation.

Figure 2:
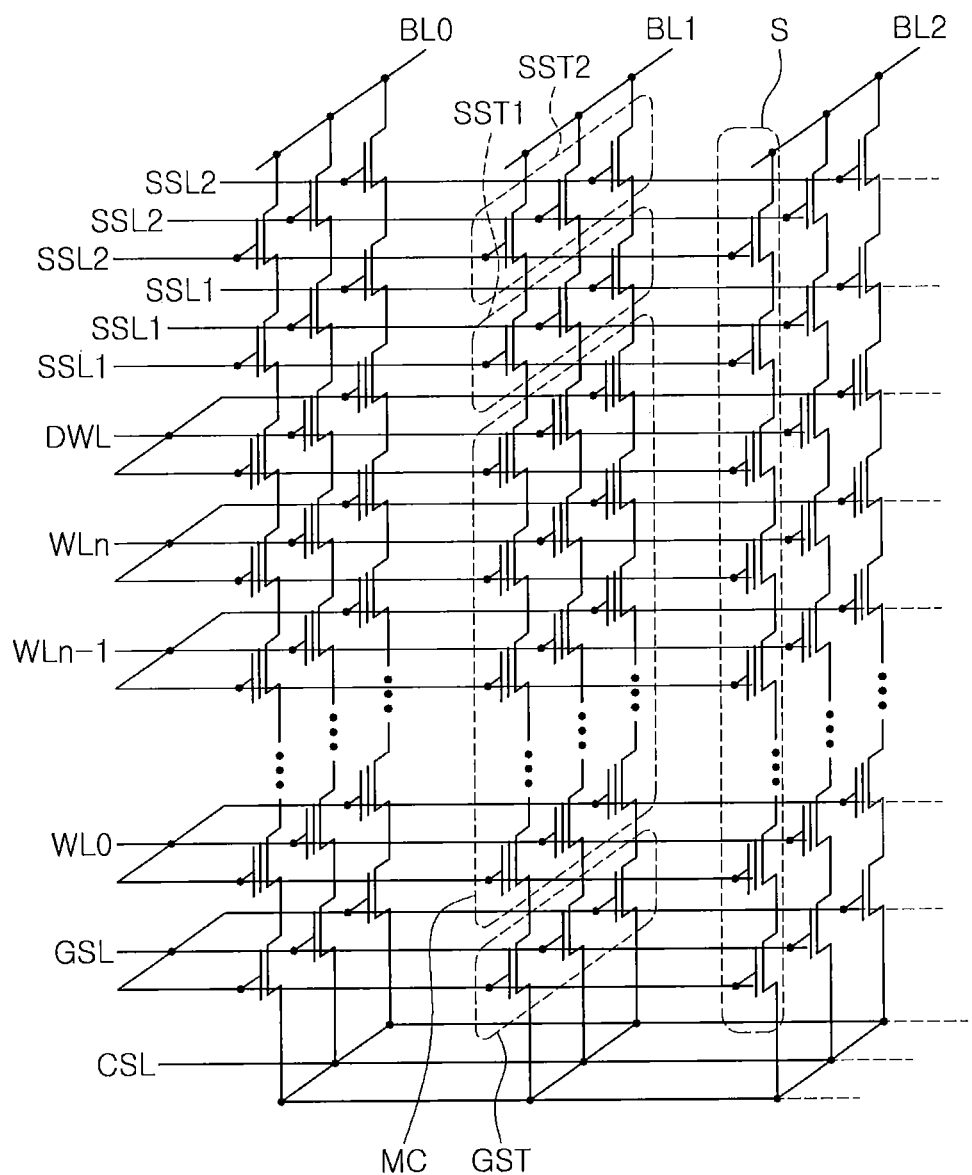
FIG. 2 is an equivalent circuit diagram of a memory cell array of a semiconductor device according to aspects of the present disclosure.

FIG. 2 is an equivalent circuit diagram of a memory cell array of a semiconductor device according to aspects of the present disclosure. FIG. 2 is a circuit diagram to illustrate the memory cell array 20 of FIG. 1.

Referring to FIG. 2, a memory cell array 20a may include a plurality of memory cell strings S, including memory cells MC, connected to each other in series, and a ground select transistor GST and string select transistors SST1 and SST2, connected to both ends of the memory cells MC, in series. The plurality of memory cell strings S may be connected to respective bit lines BL0 to BL2 in parallel. The plurality of memory cell strings S may be commonly connected to a common source line CSL. For example, a plurality of memory cell strings S may be disposed between the plurality of bit lines BL0 to BL2 and one common source line CSL. In an example embodiment, in the case of the common source line CSL, a plurality of common source lines CSL may be arranged in a two-dimensional manner.

The memory cells connected to each other in series may be controlled by word lines WL0 to WLn to select the memory cells MC. Respective memory cells MC may include data storage elements. Gate electrodes of the memory cells MC disposed to have a substantially identical distance from the common source line CSL may be commonly connected to one of the word lines WL0 to WLn, to be provided in an equipotential state. Alternatively, for example, even when the gate electrodes of the memory cells MC are disposed at a substantially identical distance from the common source lines CSL, gate electrodes disposed in different rows or columns may also be independently controlled.

The ground select transistor GST may be controlled by the ground select line GSL, and may be connected to the common source line CSL. The string select transistors SST1 and SST2 may be controlled by string select lines SSL1 and SSL2, and may be connected to bit lines BL0 to BL2. Although FIG. 2 illustrates that one ground transistor GST and two string select transistors SST1 and SST2 are connected to the plurality of memory cells MC connected to each other in series, by way of example, one ground select transistor GST and one string select transistor SST1 or SST2 may be connected to the plurality of memory cells MC connected to each other in series, or a plurality of ground select transistors GST may also be connected thereto. One or more dummy lines DWL or buffer lines may further be disposed between an uppermost word line WLn among the word lines WL0 to WLn and the string select lines SSL1 and SSL2. In an example embodiment, one or more dummy lines DWL may also be disposed between a lowermost word line WL0 and the ground select line GSL.

For example, when a signal is applied to the string select transistors SST1 and SST2 through the string select lines SSL1 and SSL2, the signal applied through the bit lines BL1, BL0 and BL2 may be transmitted to the memory cells MC connected to each other in series, and thus, data reading and writing operations may be executed. Further, as a predetermined erase voltage is applied through a substrate, an erasing operation of erasing data written to the memory cells MC may be performed. In an example embodiment, the memory cell array 20a may also include at least one dummy memory cell string electrically isolated from the bit lines BL0 to BL2.

Figure 3:
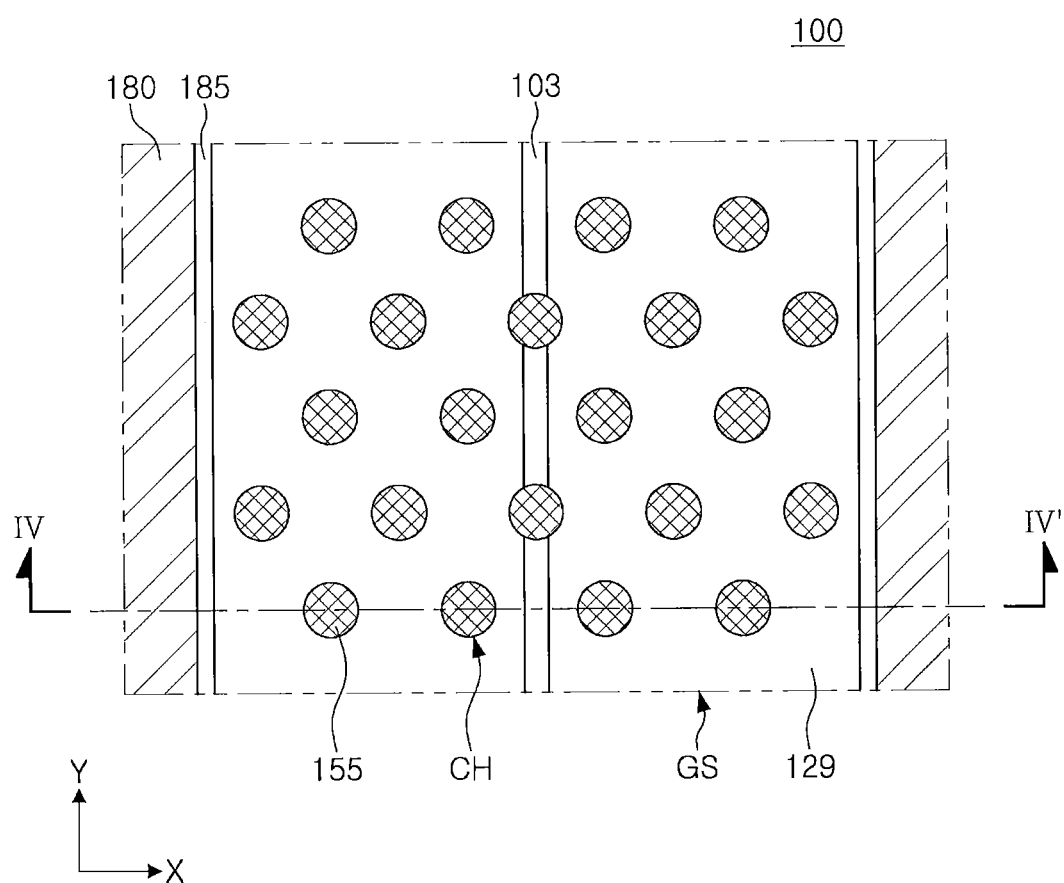
FIGS. 3 and 4 are a schematic plan view and cross-sectional view of a semiconductor device according to aspects of the present disclosure.
Figure 4:
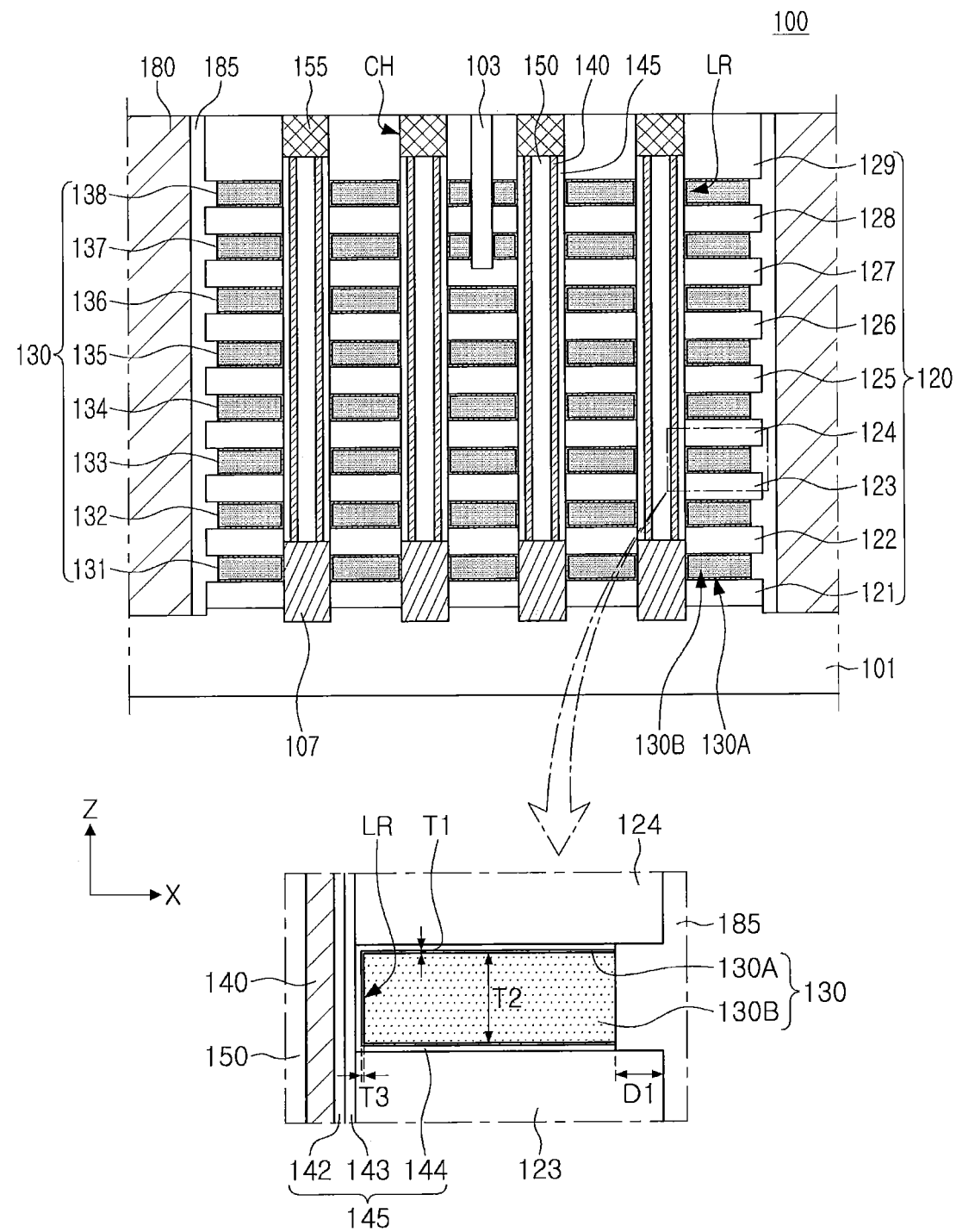

FIGS. 3 and 4 are a schematic plan view and cross-sectional view of a semiconductor device according to aspects of the present disclosure. FIG. 4 is a cross-section taken along the line IV-IV' of FIG. 3.

With reference to FIGS. 3 and 4, a semiconductor device 100 may include a substrate 101, channels CH extending in a direction perpendicular to an upper surface of the substrate 101 and including a channel region 140 disposed therein, a plurality of interlayer insulating layers 120 stacked along an external sidewall of the channels CH, and a plurality of gate electrodes 130 each including a nucleation layer 130A and a bulk layer 130B. The semiconductor device 100 may further include a gate dielectric layer 145 disposed between the channel region 140 and the gate electrodes 130, epitaxial layers 107 disposed below the channel regions 140, channel pads 155 on upper ends of the channels CH, and a source conductive layer 180 between the gate electrodes 130.

In the semiconductor device 100, one memory cell string may be configured for each channel region 140, and a plurality of memory cell strings may be arranged in rows and columns in X and Y directions.

The substrate 101 may have an upper surface extended in X and Y directions. The substrate 101 may include a semiconductor material, for example, a group IV semiconductor material, a group III-V compound semiconductor material, or a group II-VI oxide semiconductor material. For example, an example of the group IV semiconductor material may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The channels CH may be disposed to be spaced apart from each other in rows and columns on the substrate 101. The channels CH may be arranged in a lattice form or in a zigzag form in one direction. The channels CH may have a side surface perpendicular to an upper surface of the substrate 101, or may have an inclined side surface having a width reduced toward the substrate 101 according to an aspect ratio. The channel region 140 may be disposed in the channels CH. The channel region 140 in the channels CH may have an annular shape surrounding a channel insulating layer 150 provided therein, but may also have a columnar shape, such as a cylindrical or prismatic shape, without the channel insulating layer 150 therein, according to an example embodiment. The channel region 140 may be connected to the epitaxial layer 107 provided therebelow. The channel region 140 may include a semiconductor material such as polycrystalline silicon or single crystalline silicon. The semiconductor material may be an undoped material or may be a material including a p-type or n-type impurities. The channels CH disposed linearly in the X direction may be connected to different bit lines according to an arrangement of upper wiring structures connected to the channel pads 155. Also, a portion of the channels CH may be dummy channels not connected to the bit line.

The plurality of gate electrodes 131 to 138 (gate electrodes 130) may be spaced apart from each other along side surfaces of the channels CH in a direction perpendicular to an upper surface of the substrate 101. The gate electrodes 130 may respectively form gates of a ground select transistor GST, a plurality of memory cells MC, and string select transistors SST1 and SST2. The gate electrodes 130 may extend while forming the word lines WL0 to WLn, the string select lines SSL1 and SSL2, and the ground select line GSL, and the word lines WL0 to WLn may commonly be connected to one another in predetermined groups of memory cell strings S, adjacent to each other and arranged in X and Y directions. The gate electrodes 130 forming the string select lines SSL1 and SSL2 may be separated from each other by a string insulating layer 103 in the x direction. In such cases, the number of the gate electrodes 130 separated by the string insulating layer 103 is not limited to that illustrated in the drawing.

According to an example embodiment, the gate electrodes 130 of the string select transistor SST1 and SST2 and the ground select transistor GST may be one or two or more gate electrodes, and may have a structure identical to or different from those of the gate electrodes 130 of the memory cells MC. A portion of the gate electrodes 130, for example, gate electrodes 130 adjacent to the gate electrodes 130 of the ground select transistor GST or the string select transistors SST1 and SST2, may be dummy gate electrodes.

The gate electrodes 130 may include a metal, for example, tungsten (W), cobalt (Co), molybdenum (Mo), ruthenium (Ru), nickel (Ni), or the like. According to an example embodiment, the gate electrodes 130 may include polycrystalline silicon or a metal silicide material. In an example embodiment, the gate electrodes 130 may further include a diffusion barrier layer.

The gate electrodes 130 may include a nucleation layer 130A and a bulk layer 130B. The nucleation layer 130A may first be formed to provide a nucleation site assisting with nucleation for growth of the subsequent bulk layer 130B. The bulk layer 130B may be grown, based on the nucleation layer 130A, and may be formed to have a required thickness. The nucleation layer 130A and the bulk layer 130B may be disposed in a lateral-surface recess region defined between the interlayer insulating layers 120 and recessed toward the channel region 140. The nucleation layer 130A may be disposed to be in contact with a gate dielectric layer 145, between the interlayer insulating layers 120. The bulk layer 130B may be disposed on the nucleation layer 130A, and may be disposed to fill a gap between the interlayer insulating layers 120 adjacent to each other in a vertical direction.

The nucleation layer 130A and the bulk layer 130B may be formed to have different thicknesses in different processes conditions. For example, the nucleation layer 130A may have a first thickness T1 of 3 nm or less, and the bulk layer 130B may have a second thickness T2 in a range of 15 nm to 30 nm. For example, the second thickness T2 may be 5 or more times greater than the first thickness T1. The nucleation layer 130A may have a third thickness T3 in a region extending along the channel region 140, and the third thickness T3 may be the same or less than the first thickness T1. The nucleation layer 130A and the bulk layer 130B may have a recessed form, by a predetermined distance D1, from a side surface of the interlayer insulating layer 120 toward the channel region 140, but are not limited thereto.

The nucleation layer 130A and the bulk layer 130B may include different impurities, or may have different physical properties. For example, the nucleation layer 130A may include a first concentration of boron (B) or silicon (Si), and the bulk layer 130B may include a second concentration, lower than the first concentration, of boron (B) or silicon (Si). On the other hand, the bulk layer 130B may include at least one of fluorine (F), chlorine (Cl), carbon (C) and nitrogen (N), as a third concentration, and the nucleation layer 130A may include at least one of fluorine (F), chlorine (Cl), carbon (C) and nitrogen (N), as a fourth concentration lower than the third concentration.

A plurality of interlayer insulating layers 121 to 129 (interlayer insulating layers 120) may be arranged between the gate electrodes 130, to form a gate stack structure GS together with the gate electrodes 130. The interlayer insulating layers 120 may be spaced apart from each other in a Z direction and may extend in a Y direction, in a manner similar to the gate electrodes 130. The interlayer insulating layers 120 may include an insulating material such as silicon oxide or silicon nitride.

The interlayer insulating layers 120 may have a structure in which sides of the interlayer insulating layers 120 further protrude from sides of the gate electrodes 130. In an example embodiment, sides of the interlayer insulating layers 120 may also be coplanar with sides of the gate electrodes 130.

As seen in the detail portion of FIG. 4, the gate dielectric layer 145 may be disposed between the gate electrodes 130 and the channel region 140. The gate dielectric layer 145 may include a tunneling layer 142, a charge storage layer 143, and a blocking layer 144 sequentially stacked from the channel region 140. The tunneling layer 142 and the charge storage layer 143 may extend perpendicularly to an upper surface of the substrate 101 in a manner similar to the channel region 140, and the blocking layer 144 may be disposed to surround the gate electrode 130. In example embodiments, the charge storage layer 143 may be disposed to surround the gate electrode 130 together with the blocking layer 144, or a portion of the blocking layer 144 may only surround the gate electrode 130. Relative thicknesses of the layers constituting the gate dielectric layer 145 are not limited to the thicknesses illustrated in the drawings, and may be variously modified according to example embodiments. A side of the gate dielectric layer 145 is illustrated as being coplanar with a side of the gate electrode 130, but the present disclosure is not limited thereto. For example, the side of the gate dielectric layer 145 may also extend to sides of the interlayer insulating layers 120, along the interlayer insulating layers 120.

The tunneling layer 142 may allow for tunneling of a charge to be transmitted to the charge storage layer 143 via an F-N tunneling mechanism. The tunneling layer 142 may include, for example, silicon oxide ($SiO_2$), silicon nitride ($Si_3N_4$), silicon oxynitride (SiON), or combinations thereof. The charge storage layer 143 may be a charge trapping layer, and may be formed of silicon nitride. The blocking layer 144 may include silicon oxide ($SiO_2$), silicon nitride ($Si_3N_4$), silicon oxynitride (SiON), a high-k material, or combinations thereof. In this case, the high-k material refers to a dielectric material having a dielectric constant higher than that of silicon oxide ($SiO_2$). An example of the high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), or combinations thereof.

The epitaxial layer 107 may be disposed on lower ends of the channels CH while being disposed on the substrate 101 and being disposed on a side of at least one gate electrode 130. The epitaxial layer 107 may be disposed in a recessed region of the substrate 101. An upper surface of the epitaxial layer 107 may be higher than an upper surface of a lowermost gate electrode 131 and may be lower than a lower surface of a gate electrode 132 provided above the lowermost gate electrode 131, but is not limited thereto. Thus, even when an aspect ratio of the channel CH is increased, the channel region 140 may be stably electrically connected to the substrate 101 by the epitaxial layer 107, and characteristics of the ground select transistor GST between memory cell strings may be uniform. According to example embodiments, the epitaxial layer 107 may be omitted, and in such cases, the channel region 140 may be directly connected to the substrate 101.

The channel pads 155 may be disposed on upper portions of the channel regions 140 in the channels CH. The channel pads 155 may be disposed to cover upper surfaces of the channel insulating layers 150 and to be electrically connected to the channel regions 140. The channel pads 155 may include, for example, doped polycrystalline silicon.

The source conductive layer 180 may penetrate through the gate electrodes 130 and the interlayer insulating layers 120, between the channel regions 140, to be connected to the substrate 101, and may be electrically insulated from the gate electrodes 130 by a source insulating layer 185. Thus, the gate electrodes 130 may be divided to have the source conductive layer 180 therebetween in an X direction. The source conductive layer 180 may have a linear shape extending in a Y direction, and may correspond to the common source line CSL described above with reference to FIGS. 1 and 2. The source conductive layers 180 may be arranged to have a predetermined interval therebetween in an X direction, for example, may be respectively arranged every four to five columns of the channel regions 140, but are not limited thereto. The source conductive layer 180 is illustrated as having a side surface perpendicular to an upper surface of the substrate 101, but may also have a shape having a width reduced toward the substrate 101 due to a relatively high aspect ratio.

Figure 5A:
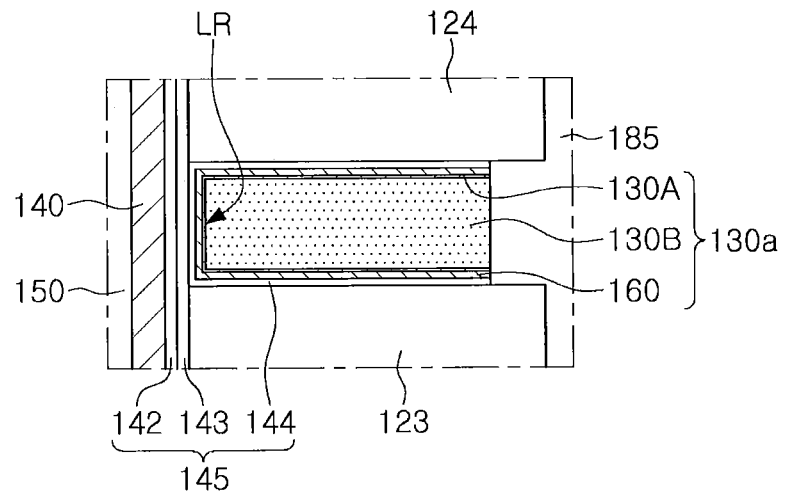
FIGS. 5A and 5B are drawings illustrating a portion of a semiconductor device according to aspects of the present disclosure.
Figure 5B:
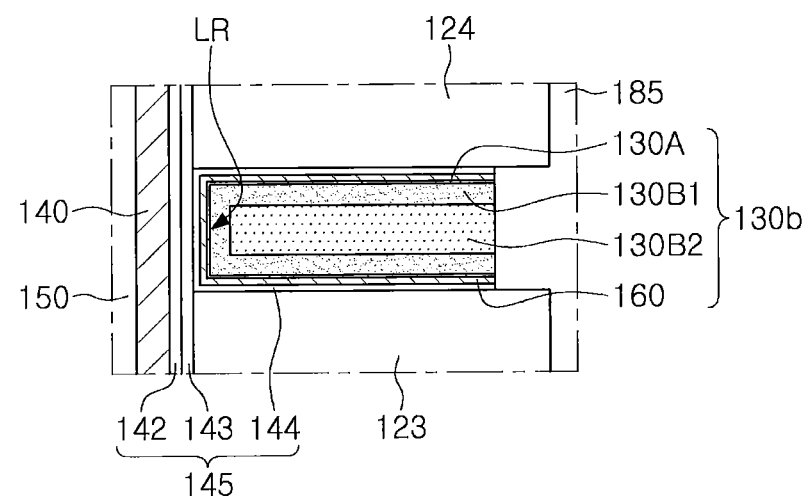

FIGS. 5A and 5B are drawings illustrating a portion of a semiconductor device according to aspects of the present disclosure, and illustrate regions corresponding to an enlarged detail portion of FIG. 4.

Referring to FIG. 5A, a region including a gate dielectric layer 145, a channel region 140 and a gate electrode 130a of memory cell strings is illustrated. In a semiconductor device according to an example embodiment, the gate electrode 130a may further include a barrier layer 160. For brevity, description of a nucleation layer 130A and a bulk layer 130B may be omitted herein in favor of the description above with reference to FIGS. 3 and 4.

The barrier layer 160 may be disposed around the nucleation layer 130A to be provided between the nucleation layer 130A and the gate dielectric layer 145. The barrier layer 160 may be a diffusion preventing layer, preventing diffusion of a material or materials, forming the nucleation layer 130A and the bulk layer 130B. The barrier layer 160 may include at least one of, for example, tungsten nitride (WN), tantalum nitride (TaN), and titanium nitride (TiN). The barrier layer 160 may have a thickness of, for example, 3 nm or less, and the thickness of the barrier layer 160 may be similar to or greater than a thickness of the nucleation layer 130A. A side of the barrier layer 160 may be coplanar with sides of the nucleation layer 130A and the bulk layer 130B, but is not limited thereto.

With reference to FIG. 5B, a gate electrode 130b may include a barrier layer 160, a nucleation layer 130A, a first bulk layer 130B1, and a second bulk layer 130B2. For example, in a semiconductor device according to an example embodiment, the gate electrode 130b may include two first and second bulk layers 130B1 and 130B2.

The first bulk layer 130B1 may be disposed on the nucleation layer 130A, and the second bulk layer 130B2 may be disposed on the first bulk layer 130B1. The second bulk layer 130B2 may have a specific resistance higher than that of the first bulk layer 130B1 and include impurities having a concentration higher than that of the first bulk layer 130B1. The impurities may be a nonmetallic element, and may include at least one of, for example, nitrogen (N), fluorine (F), chlorine (Cl), and carbon (C). The second bulk layer 130B2 may include nitrogen (N) elements having a concentration higher than that of the first bulk layer 130B1. The second bulk layer 130B2 may include at least one of fluorine (F), chlorine (Cl) and carbon (C) at a higher concentration than a concentration of the first bulk layer 130B1, and these impurities may be elements constituting source gas for formation of the second bulk layer 130B2. The second bulk layer 130B2 may be formed to have an improved morphology during a manufacturing process than that of the first bulk layer 130B1 by the impurities. An average grain size of the second bulk layer 130B2 may be greater than that of the first bulk layer 130B1, but the present disclosure is not limited thereto.

As such, as the gate electrode 130b includes two first and second bulk layers 130B1 and 130B2, a space between interlayer insulating layers 120 may be fully filled, thereby reducing defects due to infiltration of an etchant or the like during a process.

Figure 6A:
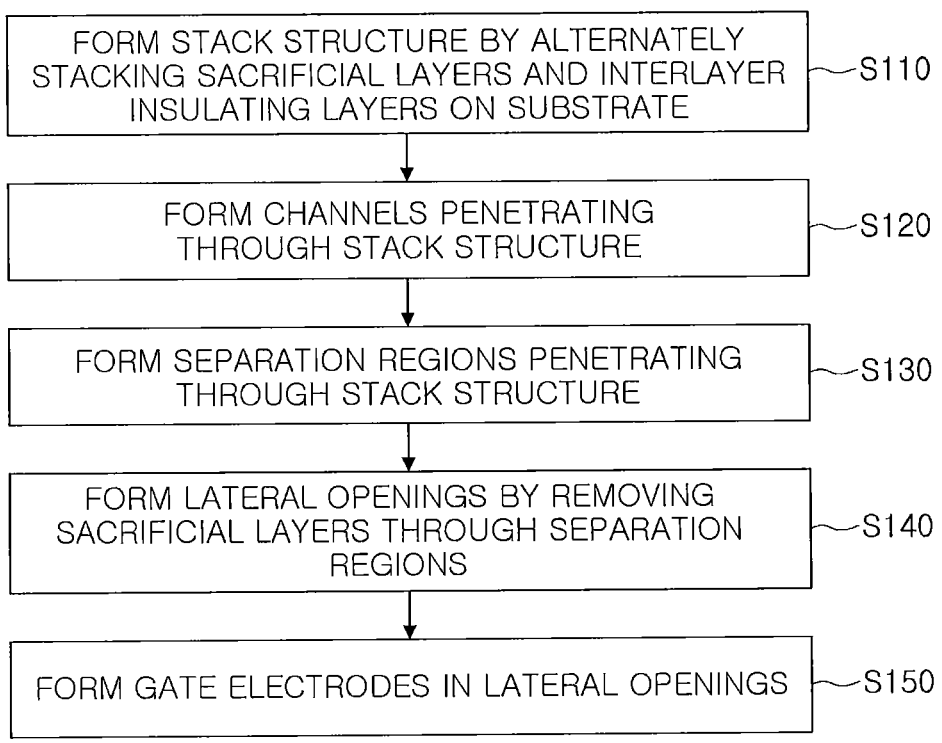
FIGS. 6A and 6B are schematic flowcharts of a method of manufacturing a semiconductor device according to aspects of the present disclosure.
Figure 6B:
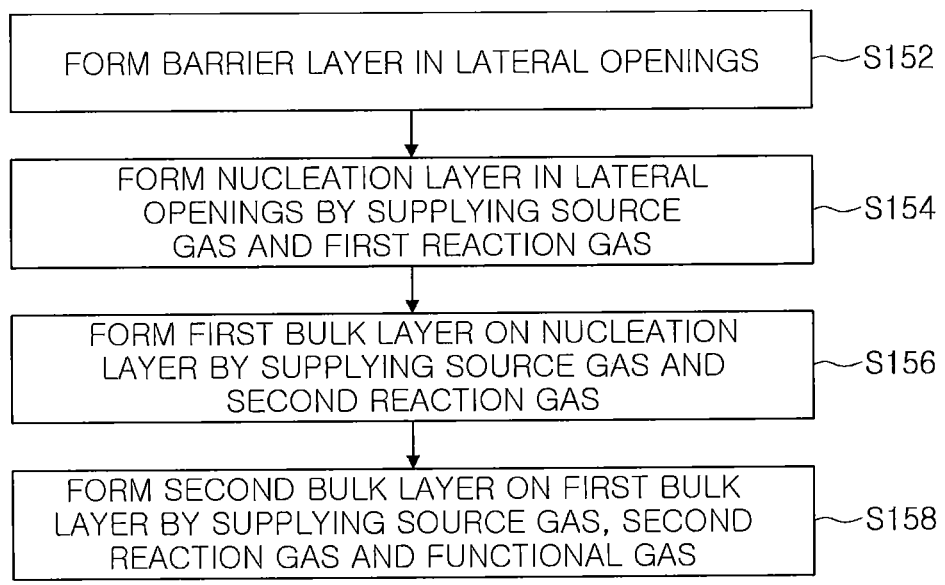

FIGS. 6A and 6B are schematic flowcharts of a method of manufacturing a semiconductor device according to aspects of the present disclosure.

FIGS. 7A to 7L are schematic drawings of main processes of a method of manufacturing a semiconductor device according to aspects of the present disclosure. In FIGS. 7A to 7L, a region corresponding to the cross-sectional view of FIG. 4 may be illustrated.

Figure 8:
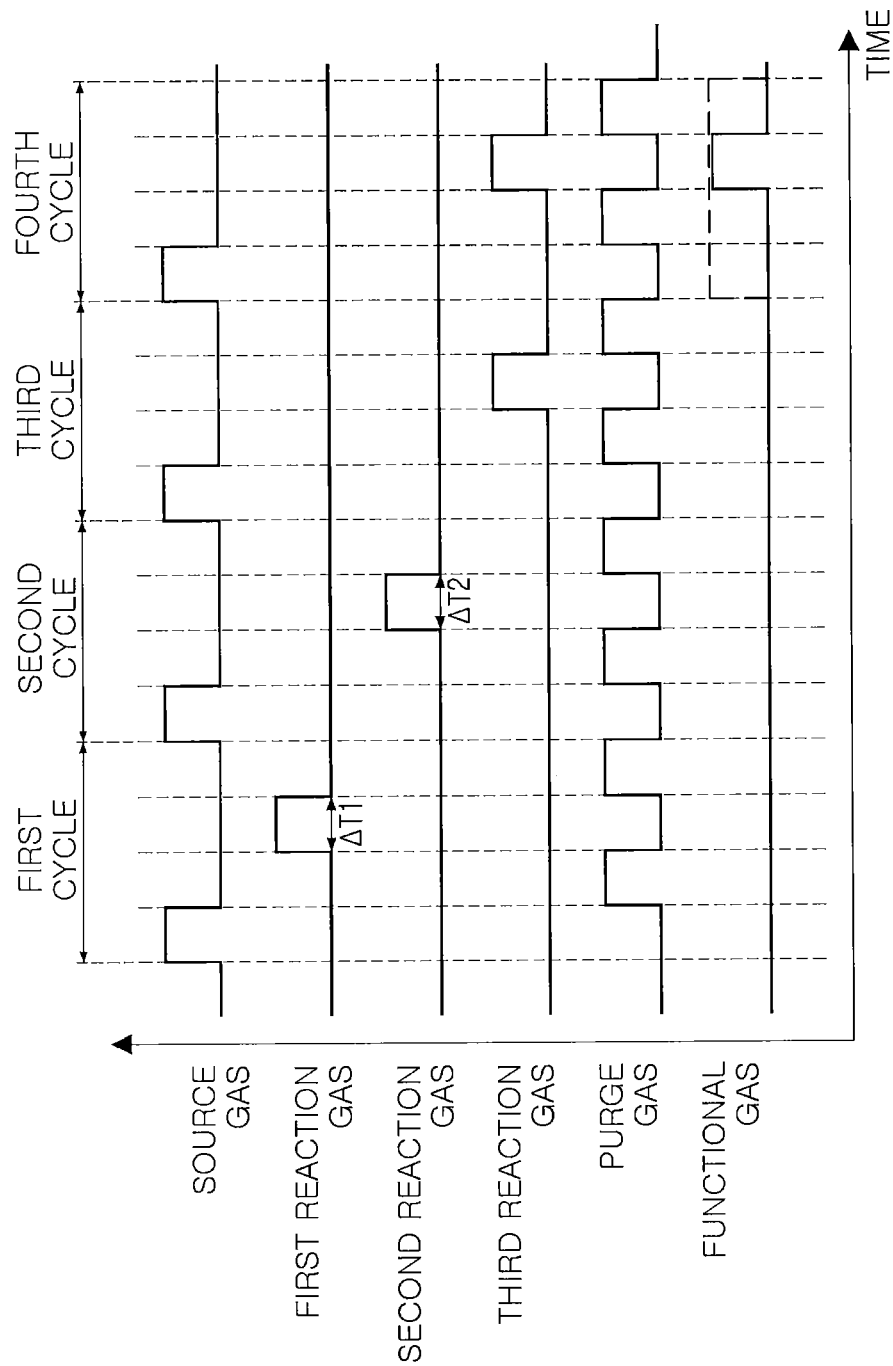
FIG. 8 is a diagram of a gas injection in deposition processes of a method of manufacturing a semiconductor device according to aspects of the present disclosure.

FIG. 8 is a diagram of a gas flow in deposition processes of a method of manufacturing a semiconductor device according to aspects of the present disclosure.

Figure 7A:
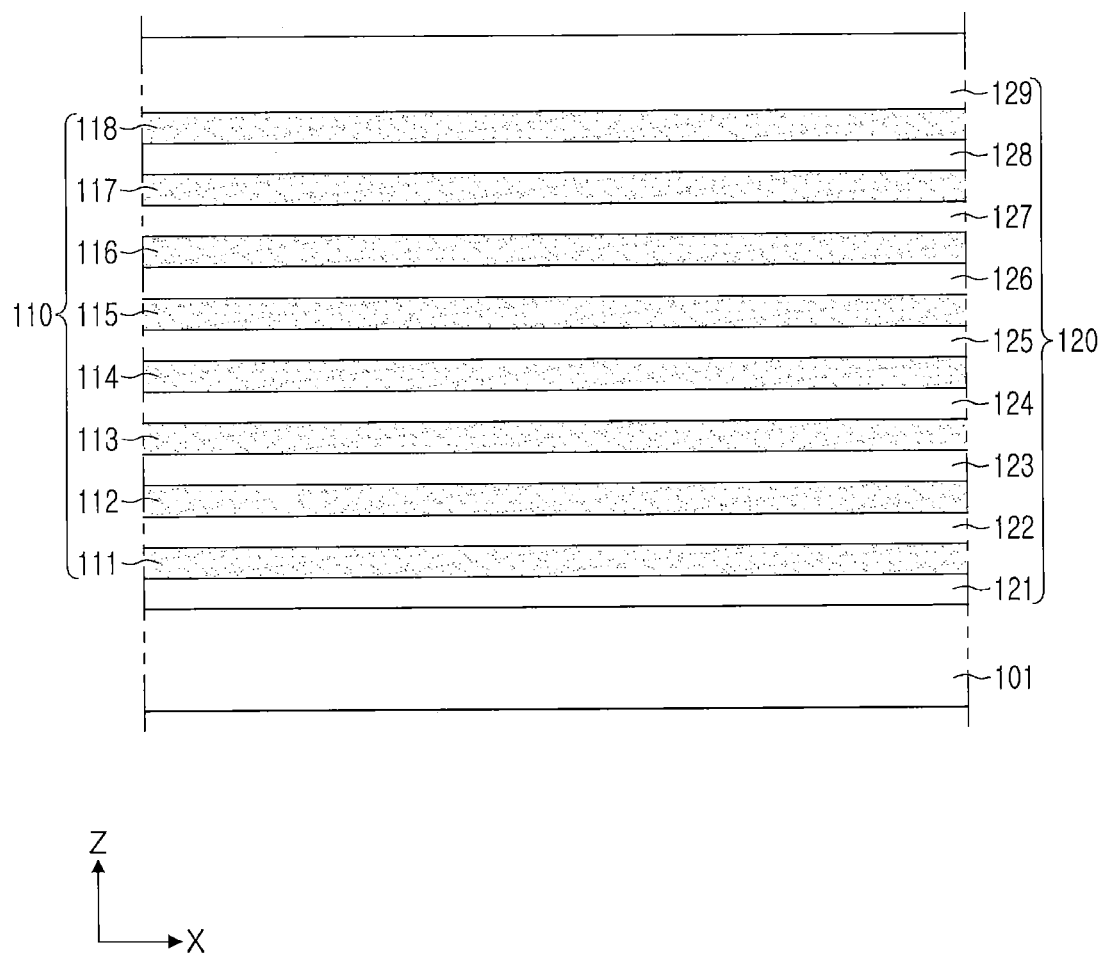
FIGS. 7A to 7L are schematic drawings of main processes of a method of manufacturing a semiconductor device according to aspects of the present disclosure.

Referring to FIGS. 6A and 7A, sacrificial layers 111 to 118 (sacrificial layers 110) and interlayer insulating layers 120 may be alternately stacked on a substrate 101, thereby forming a stack structure, in operation S110.

The sacrificial layers 110 may be layers replaced with gate electrodes 130 in a subsequent process. The sacrificial layers 110 may be formed of a material different from a material of interlayer insulating layers 120. For example, the interlayer insulating layer 120 may be formed of at least one of a silicon oxide and a silicon nitride, and the sacrificial layers 110 may be formed of a material selected from silicon, silicon oxide, silicon carbide, and silicon nitride, as a material different from a material of the interlayer insulating layers 120. In example embodiments, thicknesses of the interlayer insulating layers 120 may not all be equal to each other. For example, a lowermost interlayer insulating layer 121 may be formed to have a relatively reduced thickness, and an uppermost interlayer insulating layer 129 may be formed to have a relatively increased thickness. Thicknesses of, and the number of layers constituting, the interlayer insulating layers 120 and the sacrificial layers 110, may be variously modified from those illustrated in the drawings.

Figure 7B:
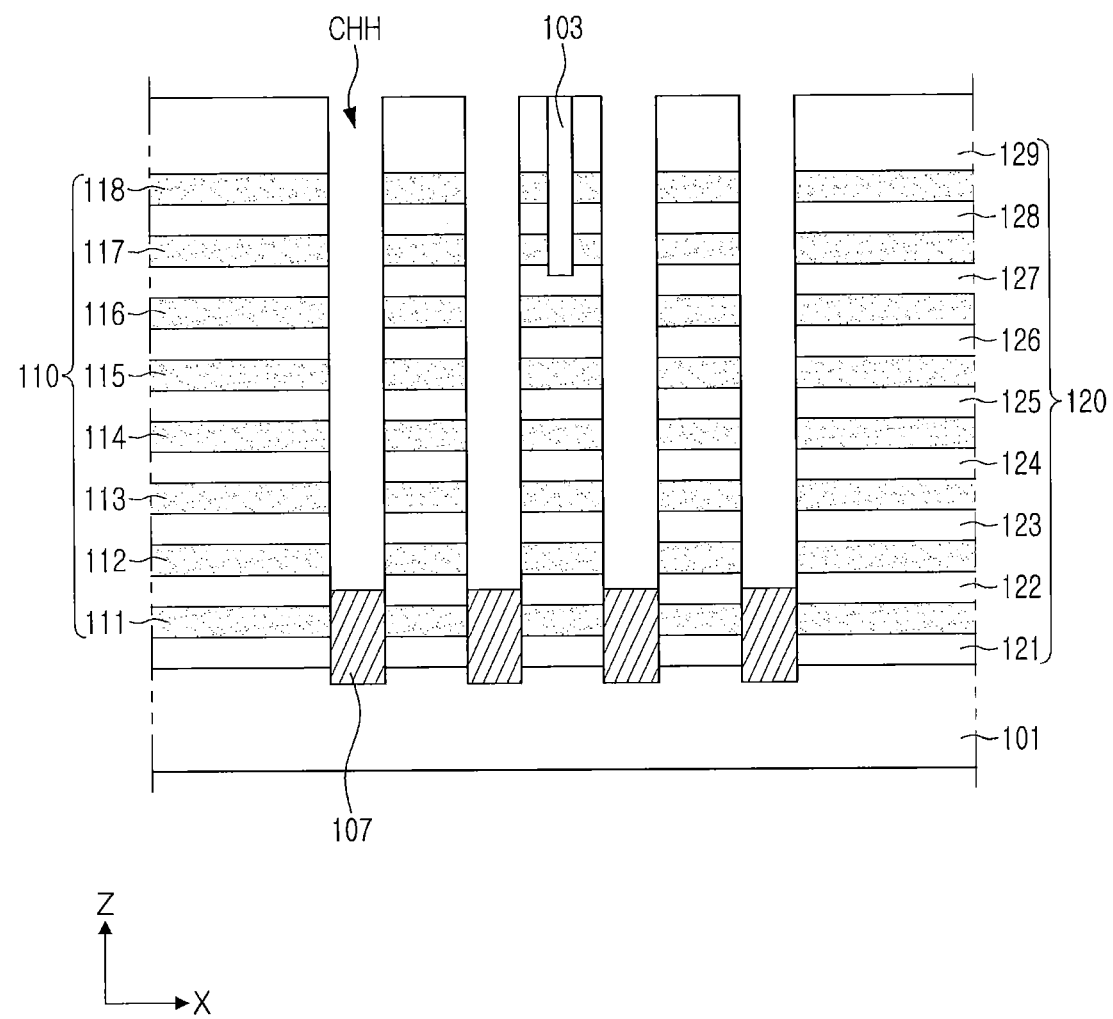

With reference to FIG. 7B, a string insulating layer 103 may be formed, channel holes CHH may be formed to penetrate through the stack structure, and an epitaxial layer 107 may be formed below the channel holes CHH.

The string insulating layer 103 may be formed by removing a predetermined number of sacrificial layers 110 and interlayer insulating layers 120 from an uppermost layer of the stack structure. An insulating material may be deposited in a region from which the sacrificial layers 110 and the interlayer insulating layers 120 have been removed, thereby forming the string insulating layer 103. The string insulating layer 103 may be formed of a material having etch selectivity with respect to the sacrificial layers 110, together with the interlayer insulating layer 120, and for example, may be formed of the same material as a material of the interlayer insulating layer 120.

The channel holes CHH may be formed by anisotropically etching the stack structure, and may be formed to have a hole form. A sidewall of the channel holes CHH may not be perpendicular to an upper surface of the substrate 101, due to a height of the stack structure. The channel holes CHH may be formed in such a manner that a portion of the substrate 101 is recessed. Subsequently, an epitaxial layer 107 may be formed in the channel holes CHH. The epitaxial layer 107 may be formed using a selective epitaxial growth (SEG). The epitaxial layer 107 may be comprised of a single layer or a plurality of layers, and may include polycrystalline silicon, single crystalline silicon, polycrystalline germanium or single crystalline germanium, doped or undoped with impurities.

Figure 7C:
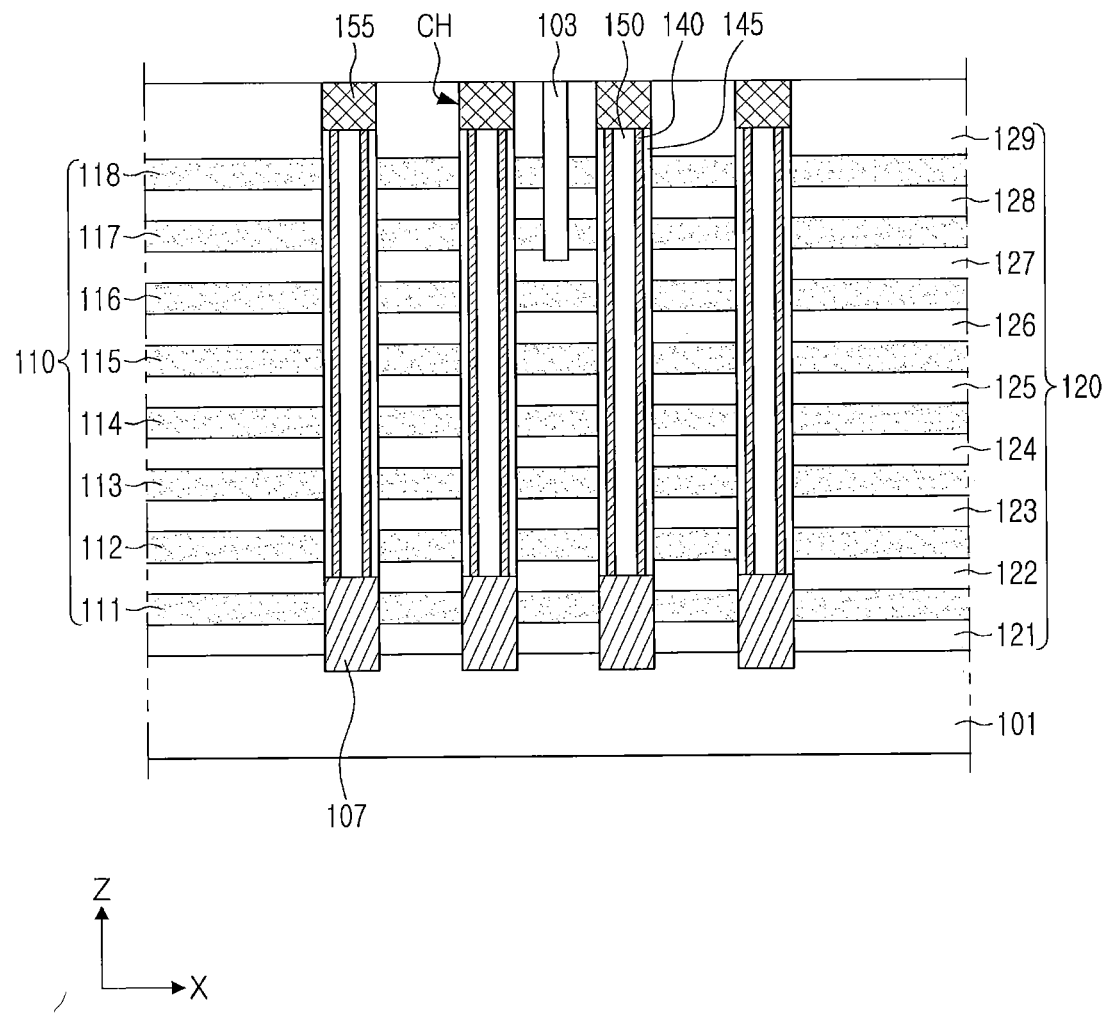

With reference to FIGS. 6A and 7C, a gate dielectric layer 145, a channel region 140, a channel insulating layer 150 and a channel pad 155 may be formed in the channel holes CHH, thereby forming channels CH, in operation S120.

The gate dielectric layer 145 may be formed to have a uniform thickness, using atomic layer deposition (ALD) or chemical vapor deposition (CVD). In this process, the entirety or a portion of the gate dielectric layer 145 may be formed, and a portion thereof extending along the channel holes CHH, to be perpendicular to an upper surface of the substrate 101, for example, the tunneling layer 142 and the charge storage layer 143 of FIG. 4, may be formed.

The channel region 140 may be formed on the gate dielectric layer 145 in the channel holes CHH. The channel insulating layer 150 may be formed of an insulating layer filling the channel holes CHH. According to example embodiments, the channel holes CHH may also be filled with a conductive material, rather than forming the channel insulating layer 150. The channel pad 155 may be formed of a conductive material, and for example, may be formed of polycrystalline silicon.

Figure 7D:
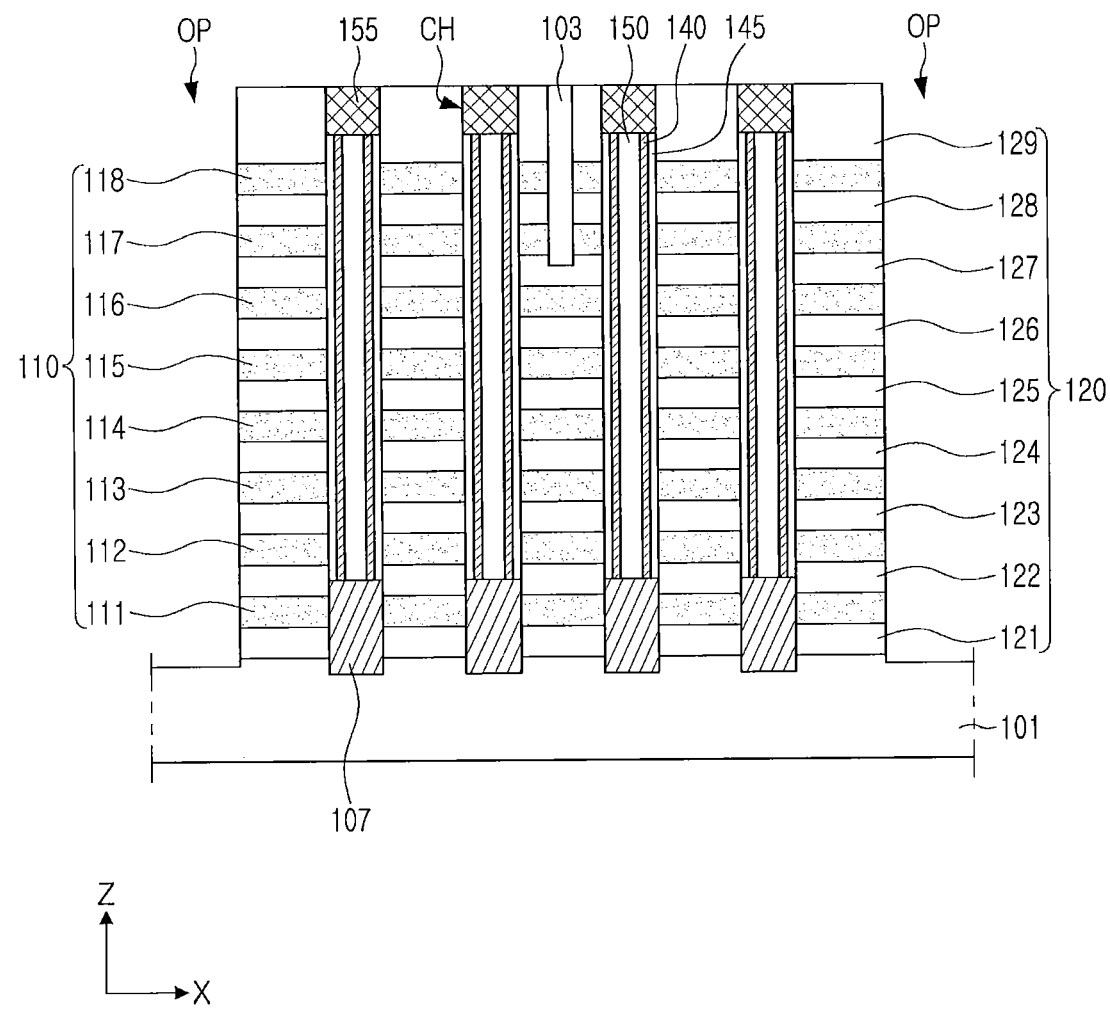

With reference to FIGS. 6A and 7D, separation regions OP, dividing the stack structure to have a predetermined interval therebetween, may be formed in operation S130.

In example embodiments, before the separation region OP is formed, an additional insulating layer may be formed on the uppermost interlayer insulating layer 129 and the channel pad 155, and thus, the channel pad 155, the channel region 140 therebelow, and the like, may be prevented from being damaged. The separation region OP may be formed by forming a mask layer using a photolithography process, and anisotropically etching the stack structure of the sacrificial layers 110 and the interlayer insulating layers 120. The separation regions OP may be formed to have a trench form extending in a Y direction, and may be formed in a region in which the source conductive layer 180 and the source insulating layer 185 of FIG. 3 are disposed.

Figure 7E:
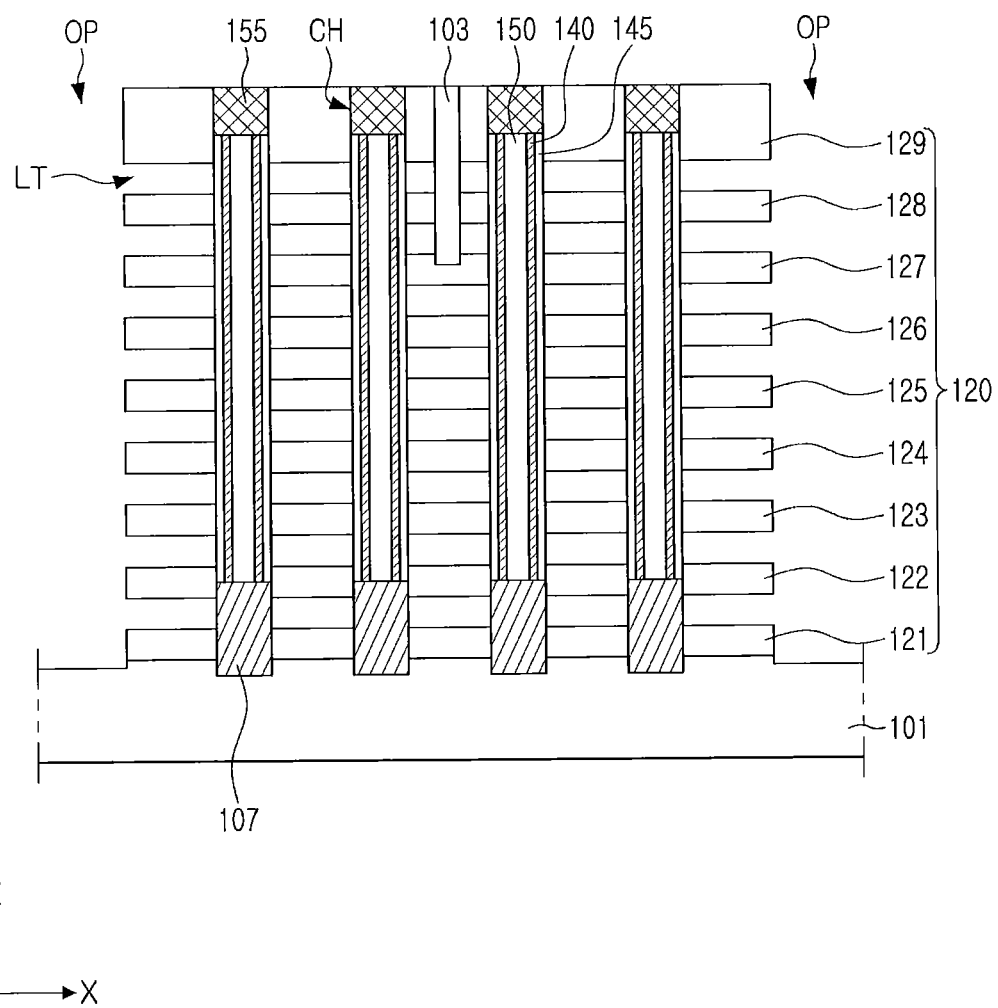

With reference to FIGS. 6A and 7E, lateral openings LT may be formed by removing the sacrificial layers 110 exposed through the separation regions OP in operation S140.

The sacrificial layers 110 may be selectively removed with respect to the interlayer insulating layers 120, using wet etching. Thus, a plurality of the lateral openings LT may be formed between the interlayer insulating layers 120, and a portion of the gate dielectric layer 145 in the channels CH, for example, sidewalls of the charge storage layer 143 or the blocking layer 144 of FIG. 4, may be exposed through the lateral openings LT.

Next, with reference to FIG. 6A, a gate electrode 130b may be formed in the lateral openings LT, in operation S150. A process of forming the gate electrode 130b having a structure similar to the structure of the example embodiment of FIG. 5B will be described with reference to FIG. 6B and FIGS. 7F to 7J, by way of example.

Figure 7F:
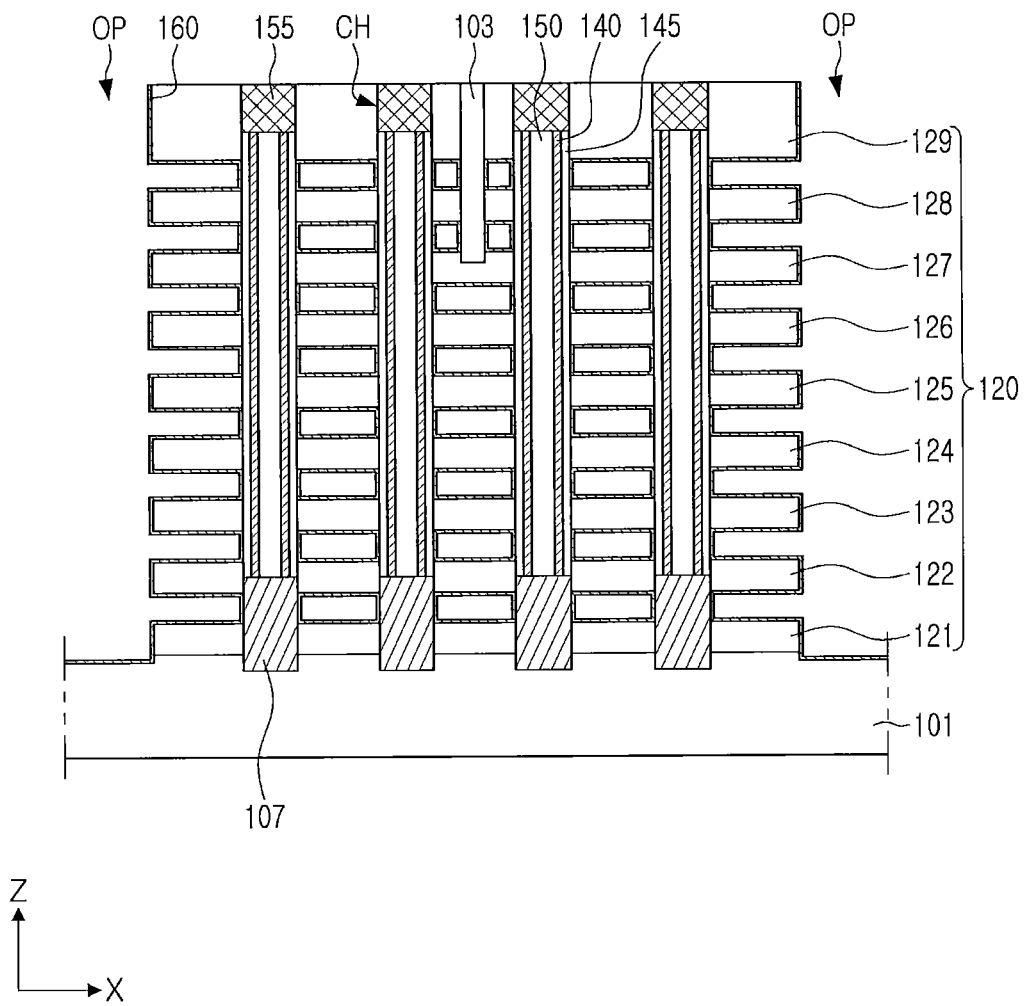

Referring to FIGS. 6B and 7F, a barrier layer 160 of the gate electrode 130b may be formed within the lateral openings LT, in operation S152.

The barrier layer 160 may be formed along the interlayer insulating layers 120 and sidewalls of the channels CH in the lateral openings LT. As illustrated in the example embodiment of FIG. 4, the barrier layer 160 may be omitted according to an example embodiment.

Figure 7G:
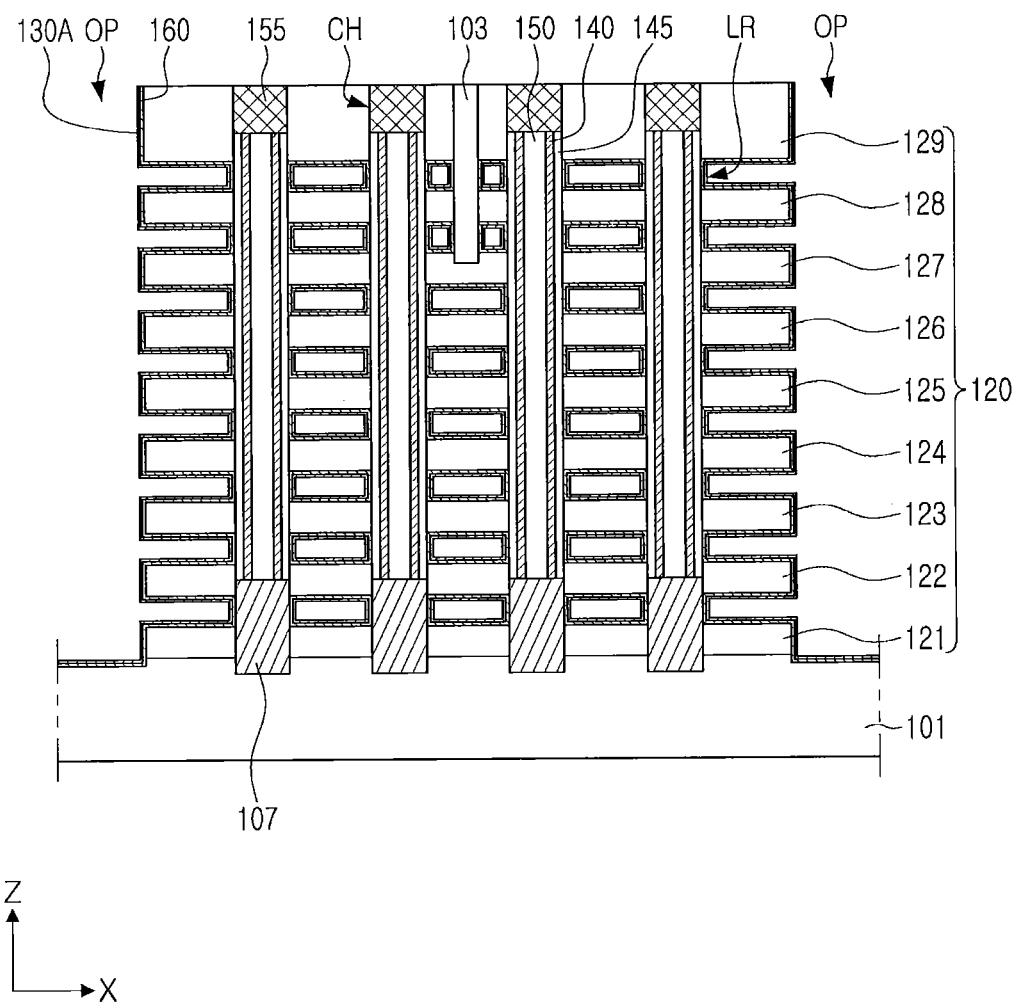

With reference to FIGS. 6B and 7G, the nucleation layer 130A of the gate electrode 130b may be formed in the lateral openings LT, in operation S154.

The nucleation layer 130A may be formed using, for example, an ALD process. In this case, as illustrated in FIG. 8, gases including a source gas, a first reaction gas and a purge gas may be provided to deposit the nucleation layer 130A. The process of forming the nucleation layer 130A may include supplying the source gas and supplying the first reaction gas, and may include supplying the purge gas after respective operations of supplying the gases. Such operations may be provided as one deposition cycle, and as a first cycle is repeatedly performed, the nucleation layer 130A may be formed. A process temperature may be within a range of, for example, about 150° C. to 450° C., and a process pressure may be within a range of, for example, about 1 Torr to 90 Torr. The process temperature and the process pressure may be changed, depending on kinds of the source gas.

First, the source gas may include a precursor that contains a material forming the nucleation layer 130A. The precursor may be supplied in a gaseous state, or may be supplied by using an inert gas as a carrier gas. The first reaction gas may be provided to assist nucleation of the precursor, and may be gas oxidizing or reducing the precursor. As the purge gas, Ar, He or $N_2$, or the like may be used, and remaining byproducts, and the source gas and the first reaction gas, not adsorbed, may be removed by the purge gas. For example, when the nucleation layer 130A is formed of tungsten (W), the source gas may be at least one of $WF_6$, $WCl_6$, $WCl_5$, $W(CO)_6$, $W(C_6H_6)_2$, $W(PF_3)_6$, $W(allyl)_4$ and $(1, 5\text{-COD})W(CO)_4$, $(C_5H_5)_2WH_2$.

The first reaction gas may be at least one of $B_2H_6$ and $SiH_4$. The first reaction gas may have a higher decomposition rate of the source gas than that of a second reaction gas used to form the first and second bulk layers 130B1 and 130B2 in a subsequent process. The first reaction gas may be supplied from a first reaction gas source to be stored in a gas charging unit, and then, may be momentarily injected from the gas charging unit to be supplied for a relatively short period of time ΔT1, which is to increase a flux of the first reaction gas, such that the first reaction gas may effectively reach an interior of the lateral openings LT and the separation region OP having a relatively high aspect ratio. The first reaction gas may be supplied, for example, at about 500 to 3000 sccm.

Thus, coverage of the nucleation layer 130A may be improved, and the nucleation layer 130A, having relatively high coverage, may prevent a fluorine (F)-containing material or the like, used in a subsequent process, from infiltrating into the interlayer insulating layer 120 and causing a defect. The coverage of the nucleation layer 130A may be about 90% or more, from which it can be appreciated that the coverage of the nucleation layer 130A may be improved, as compared with a case of coverage of about 50% to 60%, in which the gas charging unit is not used. A deposition rate of the nucleation layer 130A may be within a range of about 4 Å/cycle to about 8 Å/cycle. In this case, it can be appreciated that the nucleation layer 130A is grown at a relatively high deposition rate, as compared with a case of a deposition rate of about 2.5 Å/cycle to about 5.5 Å/cycle without using a gas charging unit.

The nucleation layer 130A may be used using $B_2H_6$ or $SiH_4$ as a reaction gas, and thus, may include a relatively high concentration of boron (B) or silicon (Si), as compared with those of the first and second bulk layers 130B1 and 130B2 formed in a subsequent process. For example, when $B_2H_6$ is used as the first reaction gas, a concentration of boron (B) in the nucleation layer 130A may increase, and thus, infiltration of fluorine (F) may be further effectively prevented.

Figure 7H:
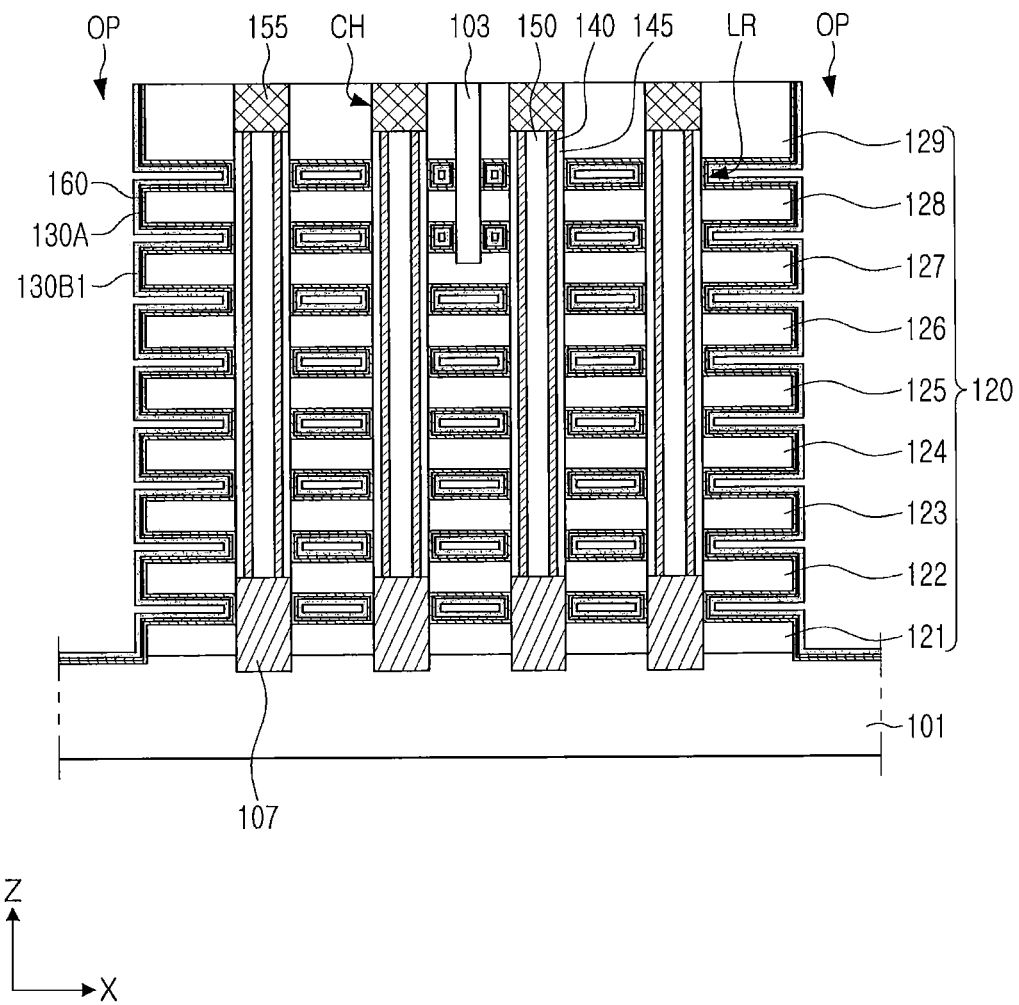

With reference to FIGS. 6B and 7H, the first bulk layer 130B1 of the gate electrode 130b may be formed on the nucleation layer 130A in the lateral openings LT, in operation S156.

Gases including a source gas, a second reaction gas and a purge gas, may be provided to form the first bulk layer 130B1 as illustrated in FIG. 8. The process of forming the first bulk layer 130B1 may include supplying the source gas and supplying the second reaction gas, and may include supplying the purge gas after respective processes of supplying the gases. Such processes may be provided as one deposition cycle, and as a second cycle is repeatedly performed, the first bulk layer 130B1 may be formed.

First, as the source gas and the purge gas, the same gases as those used in forming the nucleation layer 130A may be used, but are not limited thereto. The second reaction gas may be a type different from the first reaction gas used in the formation of the nucleation layer 130A. For example, the second reaction gas may be $H_2$. The second reaction gas may be supplied for a relatively long period of time ΔT2, as compared to the first reaction gas, during one cycle, but is not limited thereto. The second reaction gas may be supplied, for example, at about 100 sccm to about 5000 sccm. In some example embodiments, the second reaction gas may also be supplied by the gas charging unit in a manner similar to the first reaction gas, and in this case, may be supplied for a relatively short time, and gap-fill characteristics in the lateral openings LT may be improved.

The first bulk layer 130B1 may be formed to include a relatively low concentration of impurities as compared to the second bulk layer 130B2 formed in a subsequent process. To this end, the first bulk layer 130B1 may be formed at a relatively low process pressure as compared with that of the second bulk layer 130B2, and may be formed at a relatively high process temperature. Thus, the impurities may be smoothly discharged during the formation of the first bulk layer 130B1. Purging, using the purge gas, may be strengthened, by simultaneously with or separately controlling the process pressure and the process temperature, thereby forming the first bulk layer 130B1. For example, a supply time and/or a supply amount of the purge gas may be relatively increased. In this operation, the first bulk layer 130B1 may not include impurities such as boron (B), fluorine (F), chlorine (Cl), carbon (C), or the like, or may include impurities such as boron (B), fluorine (F), chlorine (Cl), carbon (C), or the like, at a relatively low concentration.

Figure 7I:
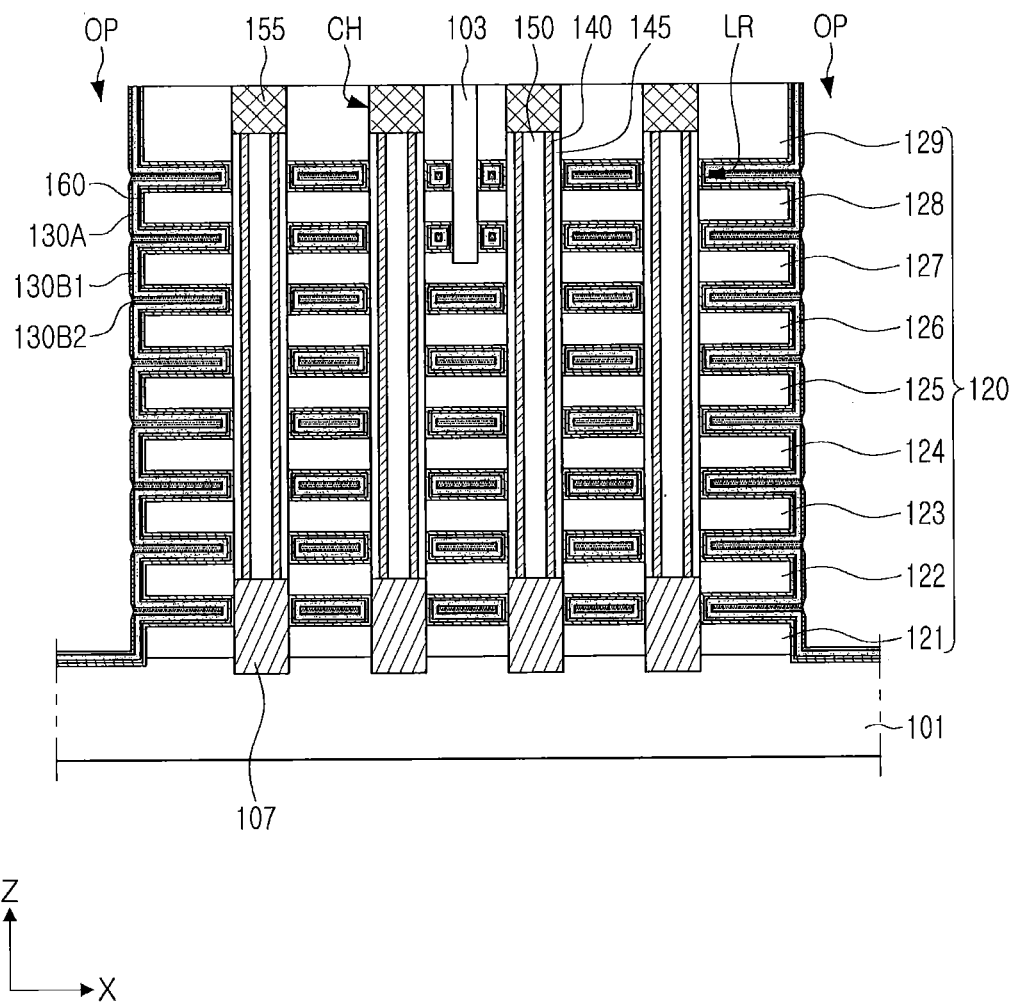

Referring to FIGS. 6B and 7I, a second bulk layer 130B2 of a gate electrode 130b may be formed on the first bulk layer 130B1 in lateral openings LT.

The second bulk layer 130B2 may fill the lateral openings LT. In example embodiments, the second bulk layer 130B2 may be formed to have a relatively small surface roughness, as compared with the first bulk layer 130B1.

The second bulk layer 130B2 may be formed using, for example, an ALD process or a CVD process. For example, when the second bulk layer 130B2 is formed using the ALD process, gases including a source gas, a third reaction gas and a purge gas, may be provided as illustrated in FIG. 8. Such operations may be performed as one deposition cycle, and a third cycle may be repeatedly performed, thereby forming the second bulk layer 130B2. The third reaction gas may be the same gas as or a different gas from the first and second reaction gases. For example, the third reaction gas may be $H_2$.

The process may be basically similar to the formation process of the first bulk layer 130B1. Thus, in example embodiments, the third reaction gas may also be supplied by the gas charging unit in a manner similar to the first reaction gas. On the other hand, as illustrated in FIG. 8, a functional gas may further be supplied in forming the second bulk layer 130B2. The functional gas may be supplied, such that additional impurities may be included in the second bulk layer 130B2. The functional gas may be continuously supplied during a process, as illustrated as a dotted line in a functional gas flow diagram of FIG. 8, or may be supplied during a supply of the third reaction gas, as illustrated as a solid line in the functional gas flow diagram of FIG. 8, but is not limited thereto. The functional gas may be, for example, N$_2$. As impurities are additionally supplied by the functional gas, a relatively high concentration of impurities may be included in the second bulk layer 130B2 even at a relatively high process temperature, as compared with a case in which the functional gas is not used.

The second bulk layer 130B2 may be formed at relatively high process pressure as compared to that of the first bulk layer 130B1, and may be formed at a relatively low process temperature. Alternatively, the second bulk layer 130B2 may also be formed by simultaneously providing a source gas and a reaction gas using a CVD process. In this process, the second bulk layer 130B2 may include impurities including at least one of fluorine (F), chlorine (Cl) and carbon (C) supplied from the source gas, and nitrogen (N) supplied from the functional gas, at a relatively high concentration.

According to example embodiments, the bulk layer 130B may also be formed on a single layer, rather than being divided into the first and second bulk layers 130B1 and 130B2, as described above in the example embodiments of FIGS. 4 and 5A. In this case, one of the formation processes of the first and second bulk layers 130B1 and 130B2 of the example embodiment may also be omitted.

In example embodiments, a bulk layer may further be formed between the first and second bulk layers 130B1 and 130B2. In this case, an added bulk layer may have a relatively reduced thickness, and may be formed of a film having relatively excellent gap-fill and step-coverage characteristics. To this end, an added bulk layer may be controlled to be deposited at a deposition rate lower than that of the first bulk layer 130B1. For example, the process temperature and pressure may be relatively low as compared to that of the case of formation of the first bulk layer 130B1, and fluxes of gases may be controlled to be relatively low.

Figure 7J:
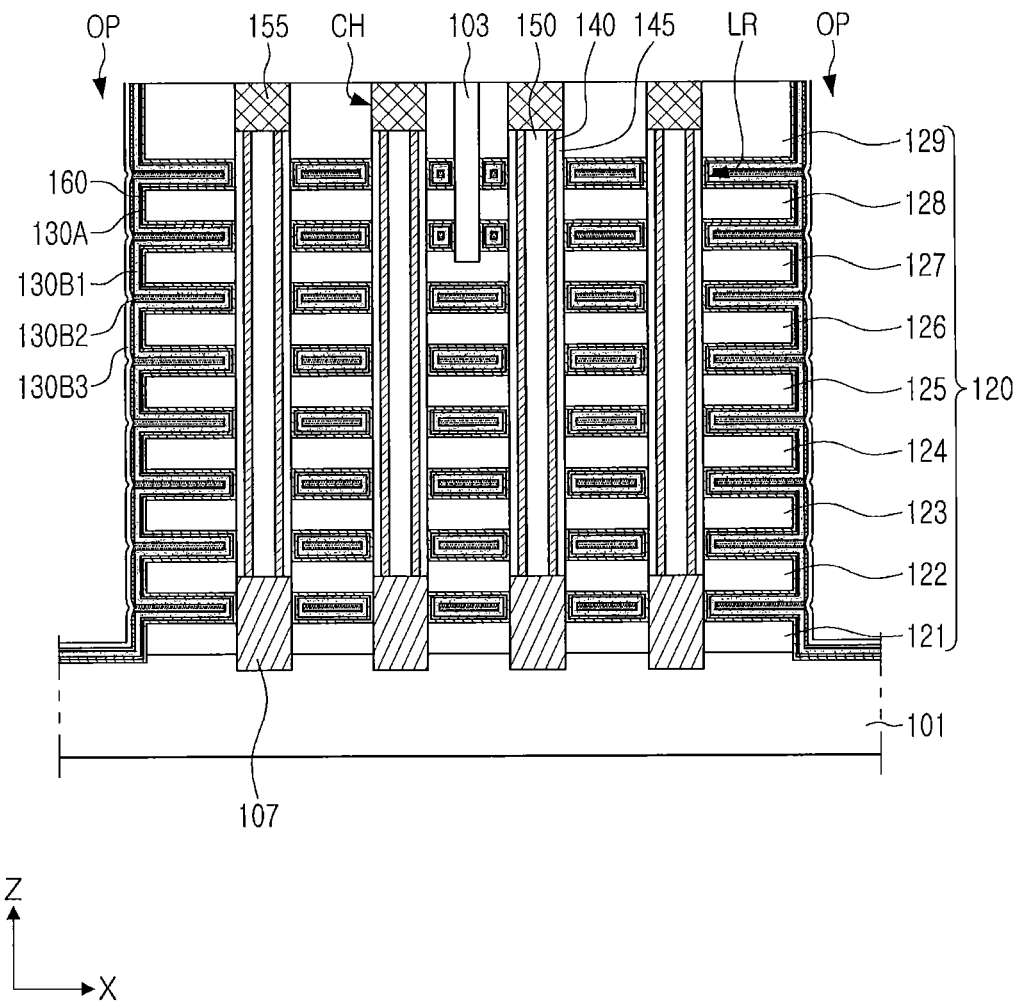

With reference to FIG. 7J, a third bulk layer 130B3 may further be formed on the first and second bulk layers 130B1 and 130B2 in the separation regions OP.

The third bulk layer 130B3 may be formed to cap the first and second bulk layers 130B1 and 130B2. The third bulk layer 130B3 may have a smaller surface roughness than that of the second bulk layer 130B2, and may be formed to have excellent morphology. In addition, the third bulk layer 130B3 may include impurities having a concentration higher than that of the first and second bulk layers 130B1 and 130B2. For example, the first to third bulk layers 130B1, 130B2 and 130B3 may include impurities having a sequentially high concentration, but the impurities thereof are not limited thereto. The third bulk layer 130B3 may be formed at higher process pressure and/or lower process temperatures than those of the first and second bulk layers 130B1 and 130B2, and may be formed using ALD or CVD. According to an example embodiment, a formation process of the third bulk layer 130B3 may also be omitted.

Figure 7K:
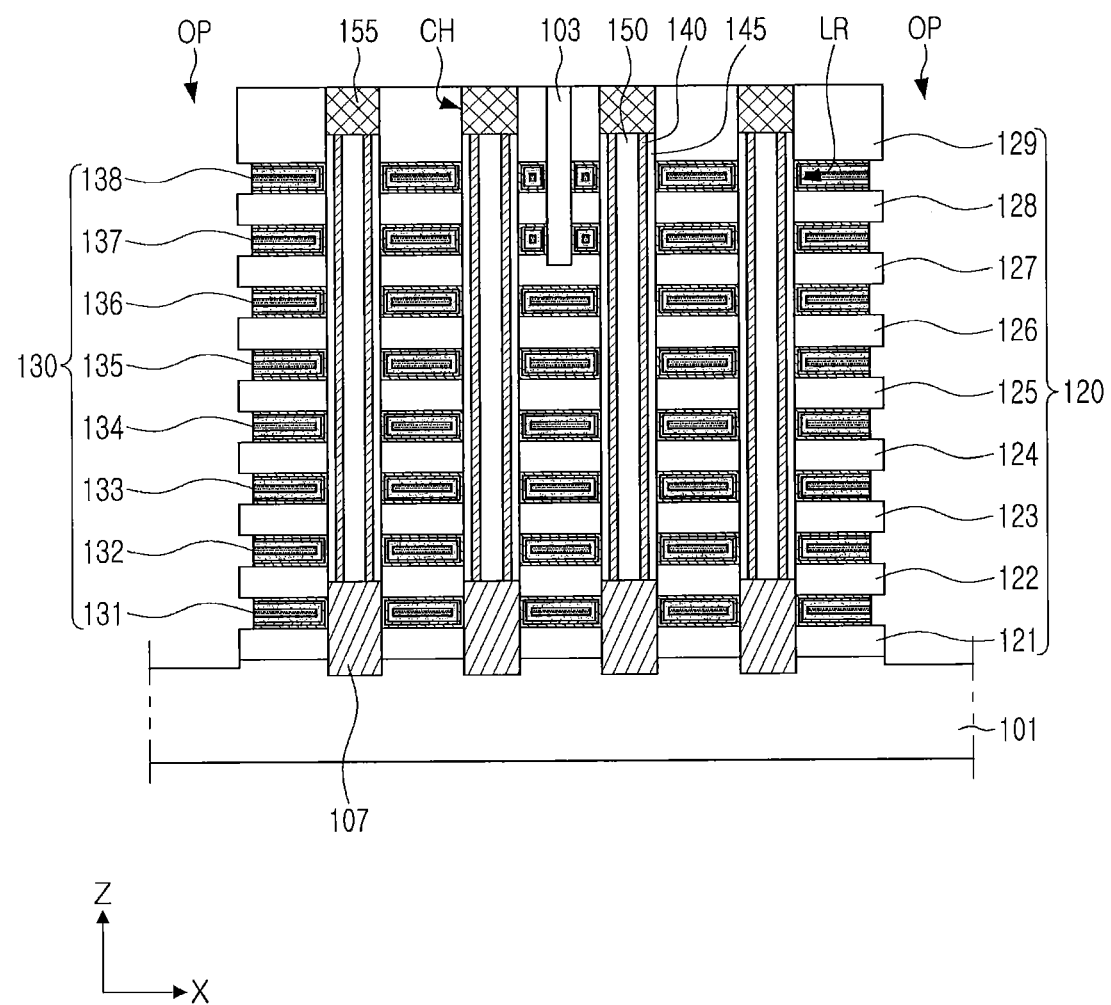

Referring to FIG. 7K, a material forming the gate electrode 130b formed on the substrate 101 and sidewalls of the interlay insulating layers 120 in the separation regions OP may be removed.

A material forming the gate electrode 130b formed in the separation regions OP may be removed by an etching process, to only form the gate electrode 130b in the lateral openings LT. The etching process may be, for example, a wet etching process. Thus, side surfaces of the gate electrodes 130b may be defined. For electrical isolation between the gate electrodes 130b adjacent to each other in a vertical direction, side surfaces of the gate electrodes 130b may be formed to be further recessed inwardly of channels CH, than side surfaces of the interlayer insulating layers 120.

As the third bulk layer 130B3 having relatively excellent morphology is formed on an outermost portion of a material forming the gate electrode 130b, when an etching process is performed in this process, the gate electrode 130b may be uniformly etched in an X direction. Thus, ultimately-formed gate electrodes 130b may have a flat side surface. The entirety of the third bulk layer 130B3 may be removed during this etching process, not to remain.

In example embodiments, an annealing process with respect to the gate electrode 130b may further be performed. A portion of impurities may be removed to prevent the gate electrode 130b from having an excessive degree of impurities.

Figure 7L:
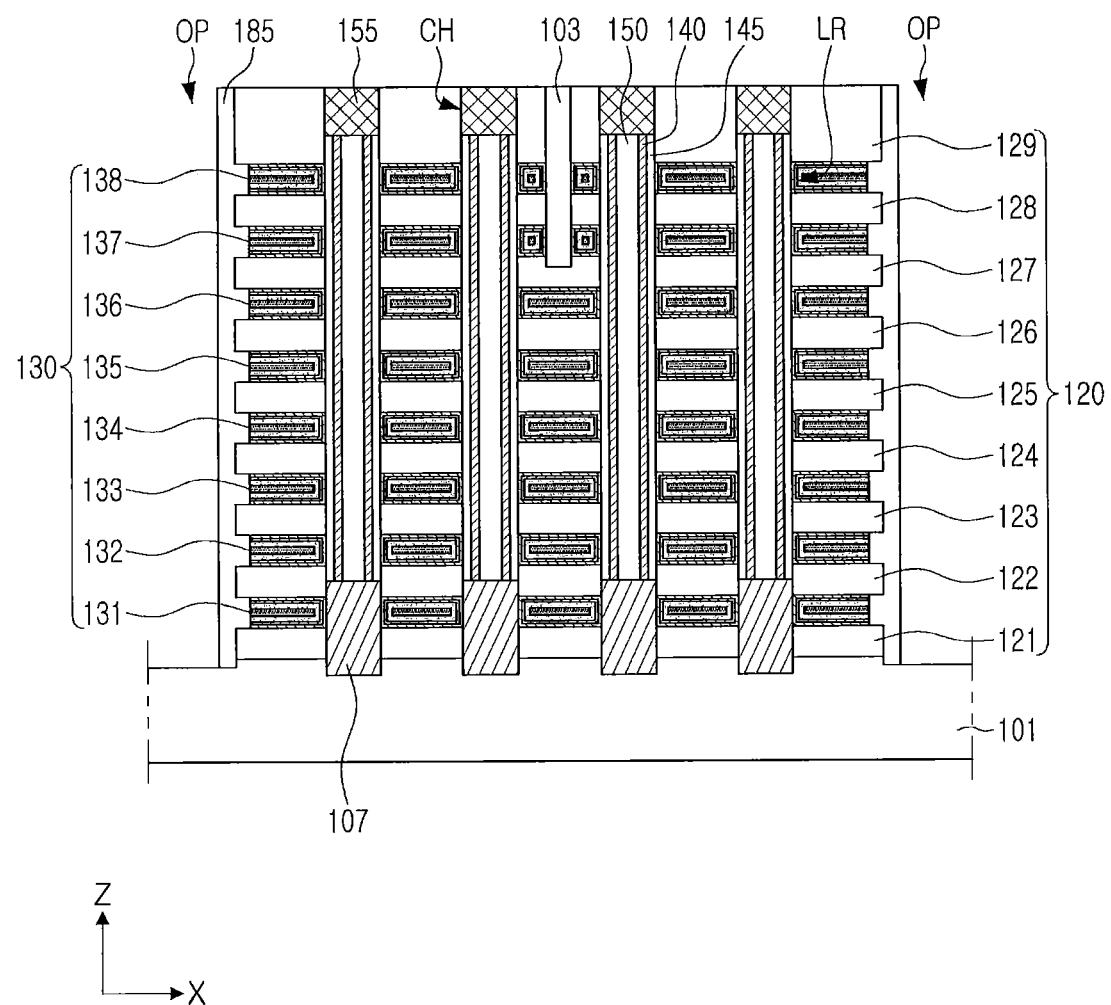

With reference to FIG. 7L, a source insulating layer 185 may be formed in the separation regions OP.

The source insulating layer 185 may be formed in the form of a spacer by forming an insulating material and removing the insulating material on the substrate 101 to expose an upper surface of the substrate 101.

Subsequently, referring to FIG. 7L and FIG. 4, a source conductive layer 180 may be formed by depositing a conductive material on the source insulating layer 185. Then, wiring structures, such as contact plugs and bit lines, may further be formed on the channel pads 155.

Figure 9:
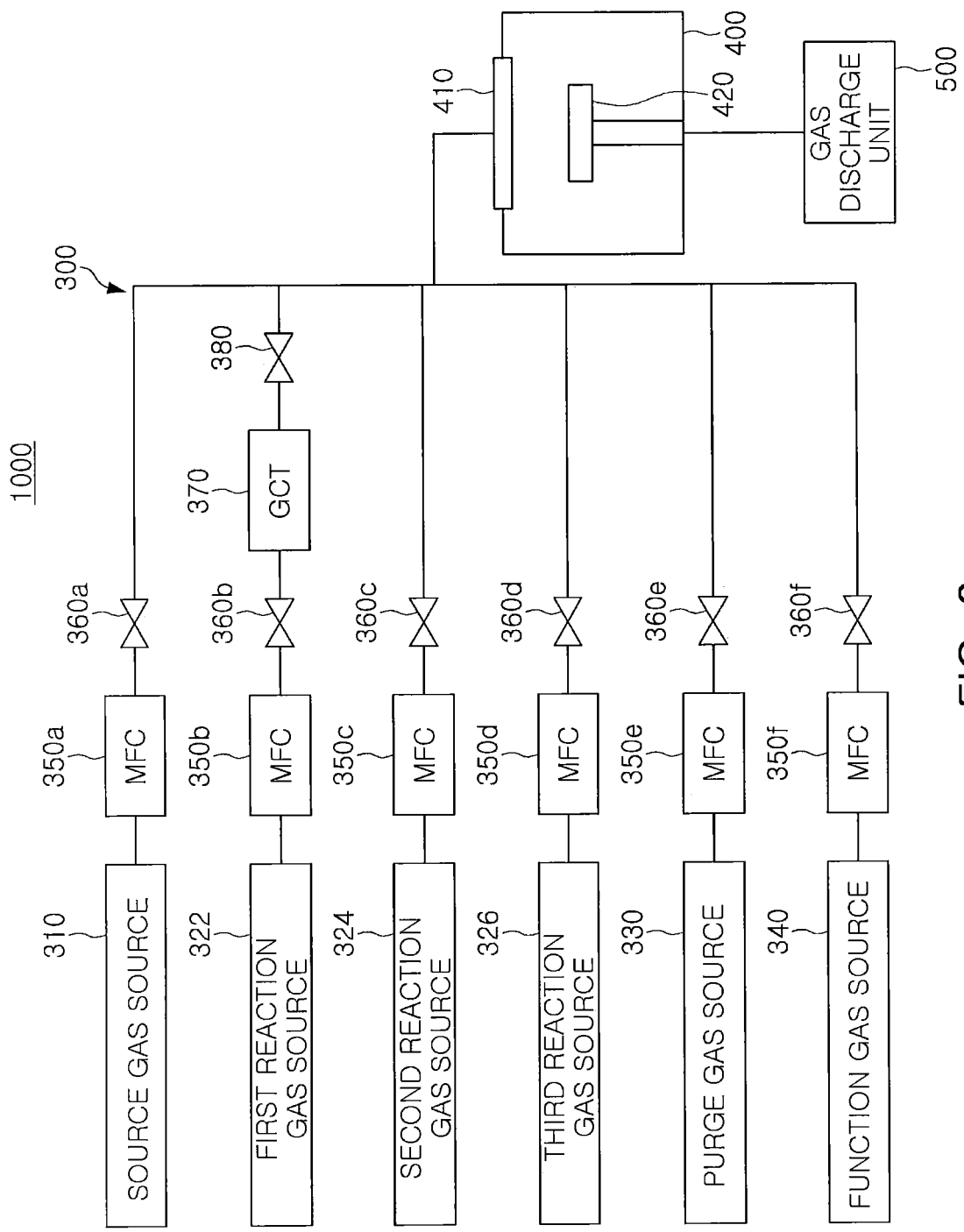
FIG. 9 is a schematic diagram of a deposition apparatus used in a process of manufacturing a semiconductor device according to aspects of the present disclosure.

FIG. 9 is a schematic diagram of a deposition apparatus used in a process of manufacturing a semiconductor device according to aspects of the present disclosure.

Figure 10A:
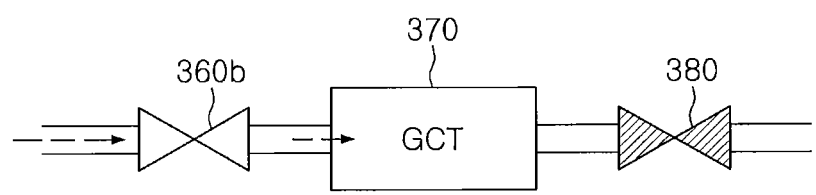
FIGS. 10A and 10B are drawings of operations of a deposition apparatus used in a process of manufacturing a semiconductor device according to aspects of the present disclosure.
Figure 10B:
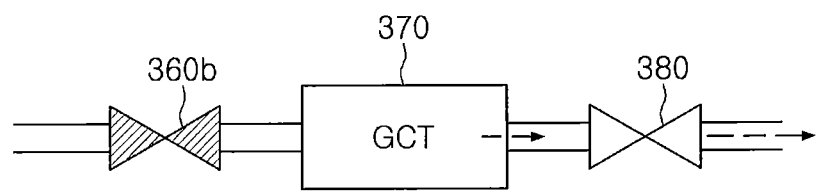

FIGS. 10A and 10B are drawings of operations of a deposition apparatus used in a process of manufacturing a semiconductor device according to aspects of the present disclosure.

With reference to FIG. 9, a deposition apparatus 1000 may include a gas supply unit 300, a deposition chamber 400, and a gas discharge unit 500. In the deposition apparatus 1000, a source gas, reaction gases, a purge gas and the like may be supplied to the deposition chamber 400 from the gas supply unit 300, deposition may be performed in the deposition chamber 400, and the gases having been used in the deposition chamber 400 may be exhausted via the gas discharge unit 500.

The gas supply unit 300 may include gas sources 310, 322, 324, 326, 330 and 340, mass flow controllers (MFC) 350a, 350b, 350c, 350d, 350e and 350f, valves 360a, 360b, 360c, 360d, 360e, 360f and 380, and a gas charging unit 370. As the gas sources 310, 322, 324, 326, 330 and 340, a source gas source 310, first to third reaction gas sources 322, 324 and 326, a purge gas source 330, and a function gas source 340 may be provided. The deposition chamber 400 may include a shower head 410 spraying the received gas, and a susceptor 420 supporting a substrate or the like to be deposited thereon. A structure of the deposition chamber 400 may be variously changed according to example embodiments. The gas discharge unit 500 may discharge residual gas or the like, of the deposition chamber 400, externally, and may be provided with an exhaust pump.

The source gas source 310, the first to third reaction gas sources 322, 324 and 326, the purge gas source 330 and the function gas source 240 may supply the source gas, the first to third reaction gases, the purge gas and the functional gas described above with reference to FIG. 6B and FIGS. 7G to 7K, respectively. In example embodiments, the number of the source gas sources 310, the first to third reaction gas sources 322, 324 and 326, the purge gas sources 330, and the function gas sources 240 may be variously changed depending on kinds of gases. For example, the deposition apparatus 1000 may include two or more source gas sources 310, or may only include the first and second reaction gas sources 322 and 324 in the case that the third reaction gas is the same as the second reaction gas.

The gas supplied from the gas sources 310, 322, 324, 326, 330 and 340 may be supplied to the deposition chamber 400, while a flux thereof is controlled by the mass flow controllers 350a, 350b, 350c, 350d, 350e and 350f. The valves 360a, 360b, 360c, 360d, 360e, 360f and 380 may be installed between the mass flow controllers 350a, 350b, 350c, 350d, 350e and 350f and the deposition chamber 400, to pass or block the gas supplied to the deposition chamber 400, depending on the flux having been adjusted by the mass flow controllers 350a, 350b, 350c, 350d, 350e and 350f.

The gas charging unit 370 may also be disposed between the first reaction gas source 322 and the deposition chamber 400. In the case of the firsts reaction gas used for the formation of the nucleation layer 130A described above with reference to FIG. 7G, the first reaction gas from the first reaction gas source 322 may be supplied to the deposition chamber 400 via the gas charging unit 370. The gas charging unit 370 may be a gas charging tank in which a predetermined amount of the first reaction gas may be filled and may be momentarily supplied at a relatively high injection amount. According to example embodiments, the gas charging unit 370 may also be connected to the second reaction gas source 324 and/or the third reaction gas source 326.

Referring to FIGS. 10A and 10B, a method of supplying the first reaction gas using the gas charging unit 370 will be described. As illustrated in FIG. 10A, a front valve 360b of the gas charging unit 370 may first be opened and a rear valve 380 may be closed. Thus, the first reaction gas may flow from the first reaction gas source 322 to be charged into the gas charging unit 370. Next, as illustrated in FIG. 10B, the front valve 360b of the gas charging unit 370 may be closed, and the rear valve 380 may be opened. Thus, the first reaction gas filled in the gas charging unit 370 may be supplied to the deposition chamber 400 at a relatively high flux in a short time. An amount of the first reaction gas filled in the gas charging unit 370 may be controlled by the mass flow controller 350b, or may be controlled by a size and/or pressure of the gas charging unit 370, but the present disclosure is not limited thereto. In example embodiments, the first reaction gas may be supplied from the gas charging unit 370, and sequentially or simultaneously, may be supplied directly from the first reaction gas source 322 by a separate bypass. For example, as illustrated in FIG. 7G, even when an aspect ratio of the separation region OP is increased and the lateral openings LT are formed to be relatively narrow, as the first reaction gas is supplied by the gas charging unit 370 as described above, the first reaction gas may be effectively supplied into the lateral openings LT. Thus, coverage of the nucleation layer 130A may be improved, and deposition of the bulk layer 130B grown based on nucleation layer 130A may also be efficiently performed.

Figure 11:
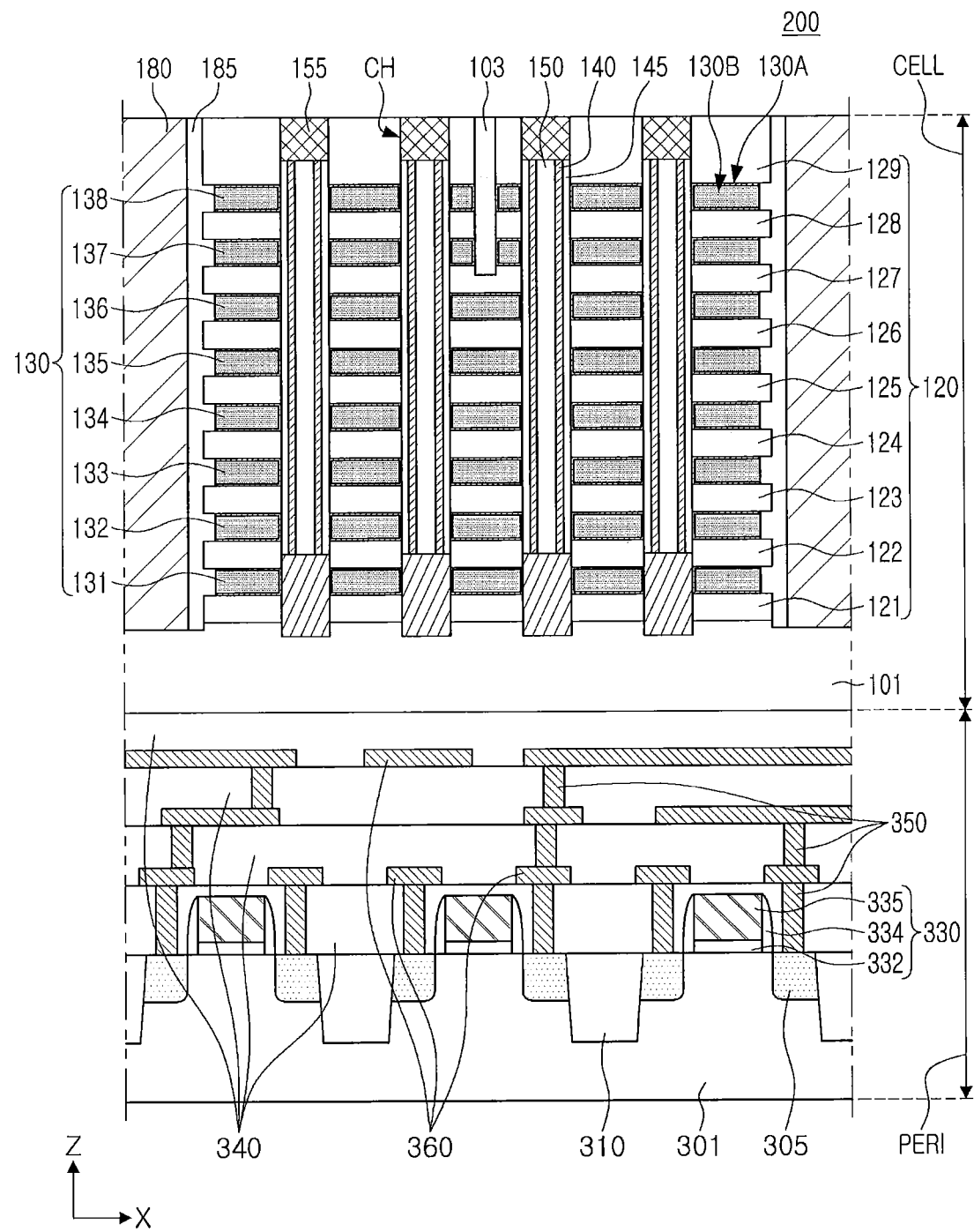
FIG. 11 is a schematic cross-sectional view of a semiconductor device according to aspects of the present disclosure.

FIG. 11 is a schematic cross-sectional view of a semiconductor device according to aspects of the present disclosure.

Referring to FIG. 11, a semiconductor device 200 may include a memory cell region CELL and a peripheral circuit region PERI. The memory cell region CELL may be disposed on an upper end of the peripheral circuit region PERI. According to some example embodiments, the memory cell region CELL may be disposed on a lower end of the peripheral circuit region PERI.

The memory cell region CELL may include a substrate 101, channels CH including a channel region 140 disposed therein, while extending in a direction perpendicular to an upper surface of the substrate 101, a plurality of interlayer insulating layers 120 stacked along external sidewalls of the channels CH, and a plurality of gate electrodes 130 including a nucleation layer 130A and a bulk layer 130B, as described above with reference to FIGS. 3 and 4. In the example embodiment, the memory cell region CELL is illustrated as having the same structure as the example embodiment of FIG. 4, but is not limited thereto. Thus, the memory cell region CELL may have a structure according to various example embodiments.

The peripheral circuit region PERI may include a base substrate 301, circuit elements 330 disposed on the base substrate 301, contact plugs 350, and wiring lines 360.

The base substrate 301 may have an upper surface extended in X direction and a direction perpendicular to the X direction. In the base substrate 301, device isolation layers 310 may be formed to define an active region. Source/drain regions 305 including impurities may be disposed in a portion of the active region. The base substrate 301 may include a semiconductor material, for example, a group IV semiconductor material, a group III-V compound semiconductor material, or a group II-VI oxide semiconductor material.

The circuit elements 330 may include a planar transistor. Each of the circuit elements 330 may include a circuit gate insulating layer 332, a spacer layer 334, and a circuit gate electrode 335. The source/drain regions 305 may be disposed in the base substrate 301 on both sides of the circuit gate electrode 335 to serve as a source region or a drain region of the circuit element 330.

A plurality of peripheral-region insulating layers 340 may be disposed on the circuit elements 330, above the base substrate 301. The contact plugs 350 may penetrate through the peripheral-region insulating layers 340 to be connected to the source/drain regions 305. An electrical signal may be applied to the circuit elements 330 via the contact plugs 350. The contact plugs 350 may also be connected to the circuit gate electrodes 335 in a region not illustrated in the drawing. The wiring lines 360 may be connected to the contact plugs 350, and may be arranged in a plurality of layers.

In the case of the semiconductor device 200, after the peripheral circuit region PERI is first formed, the substrate 101 of the memory cell region CELL may be formed thereon to form the memory cell region CELL. The substrate 101 may have the same size as that of the base substrate 301, or may be formed to have a size smaller than that of the base substrate 301. The memory cell region CELL and the peripheral circuit region PERI may be connected to each other in a region not illustrated in the drawing. For example, one end of the gate electrode 130 in the direction perpendicular to the X direction may be electrically connected to the circuit element 330.

As set forth above, according to example embodiments, by forming a nucleation layer of a gate electrode using a gas charging method, a method of manufacturing a semiconductor device having improved reliability may be provided.

While example embodiments have been shown and described above, it will be apparent to those skilled in the art that modifications and variations could be made without departing from the scope of the present inventive concepts as defined by the appended claims.

What is claimed is:

1. A method of manufacturing a semiconductor device, comprising:
   alternately stacking sacrificial layers and interlayer insulating layers on a substrate to form a stack structure;

forming channels in the stack structure;
forming separation regions in the stack structure;
forming lateral openings by removing the sacrificial layers through the separation regions; and
forming gate electrodes in the lateral openings,
wherein the forming the gate electrodes includes:
  forming a nucleation layer in the lateral openings by supplying a source gas and a first reaction gas; and
  forming a bulk layer on the nucleation layer in the lateral openings by supplying the source gas and a second reaction gas, different from the first reaction gas, and
wherein the first reaction gas is supplied from a first reaction gas source, stored in a gas charging tank, and supplied from the gas charging tank.

2. The method of claim 1, wherein the nucleation layer includes a first concentration of boron (B) or silicon (Si), and wherein the bulk layer includes boron (B) or silicon (Si) having a second concentration, lower than the first concentration.

3. The method of claim 2, wherein the first reaction gas comprises $B_2H_2$ or $SiH_4$.

4. The method of claim 3, wherein the second reaction gas comprises $H_2$.

5. The method of claim 1, wherein the first reaction gas has a higher decomposition rate of the source gas than a source gas decomposition rate of the second reaction gas.

6. The method of claim 1, wherein the gate electrodes include tungsten (W), and the source gas includes a tungsten precursor.

7. The method of claim 1, wherein the nucleation layer has a thickness less than a thickness of the bulk layer.

8. The method of claim 1, wherein a concentration of at least one of fluorine (F), nitrogen (N), chlorine (Cl) or carbon (C) in the nucleation layer is lower than a concentration of the at least one thereof in the bulk layer.

9. The method of claim 1, wherein the forming the bulk layer comprises:
  forming a first bulk layer on the nucleation layer; and
  forming a second bulk layer having a specific resistivity higher than a specific resistivity of the first bulk layer, and including a concentration of impurities higher than a concentration of impurities of the first bulk layer, on the first bulk layer.

10. The method of claim 9, wherein in the forming of the second bulk layer, the second reaction gas is supplied from a second reaction gas source, stored in a separate gas charging tank, and supplied from the separate gas charging tank.

11. The method of claim 9, wherein in the forming of the second bulk layer, a functional gas for a supply of the impurities is supplied.

12. The method of claim 11, wherein the functional gas comprises nitrogen gas, and the impurities includes nitrogen (N).

13. The method of claim 9, wherein the first bulk layer is formed at a first process temperature, wherein the second bulk layer is formed at a second process temperature, and wherein the first process temperature is higher than the second process temperature.

14. The method of claim 9, wherein the first bulk layer is formed at a first process pressure, wherein the second bulk layer is formed at a second process pressure, and wherein the first process pressure is lower than the second process pressure.

15. A method of manufacturing a semiconductor device, comprising:
  alternately stacking sacrificial layers and interlayer insulating layers on a substrate to form a stack structure;
  forming channels in the stack structure;
  forming separation regions in the stack structure;
  forming lateral openings by removing the sacrificial layers through the separation regions; and
  forming gate electrodes in the lateral openings,
  wherein the forming the gate electrodes includes:
    forming a nucleation layer in the lateral openings;
    forming a first bulk layer on the nucleation layer in the lateral openings;
    forming a second bulk layer on the first bulk layer, wherein the second bulk layer has a specific resistivity higher than a specific resistivity of the first bulk layer, and forming a third bulk layer on the second bulk layer, outside of the lateral openings in the separation regions.

16. The method of claim 15, further comprising removing the first to third bulk layers formed in the separation regions, such that the first bulk layer and the second bulk layer only remain in the lateral openings.

17. A method of manufacturing a semiconductor device, comprising:
  forming a stack structure by alternately stacking sacrificial layers and interlayer insulating layers on a substrate;
  forming channels in the stack structure;
  forming lateral openings by removing the sacrificial layers; and
  forming gate electrodes including a nucleation layer and a bulk layer, in the lateral openings,
  wherein the nucleation layer and the bulk layer are formed using different first and second reaction gases, respectively and include impurities having different first and second concentrations, respectively.

18. The method of claim 17, wherein the nucleation layer is formed by supplying a source gas and the first reaction gas, and wherein the first reaction gas is supplied from a reaction gas source, stored in a gas charging unit, and supplied from the gas charging unit.

19. The method of claim 17, wherein the impurities comprise boron (B) or silicon (Si), and the first concentration of impurities is higher than the second concentration of impurities.

20. The method of claim 17, wherein the impurities comprise nitrogen (N), and the first concentration of impurities is lower than the second concentration of impurities.

* * * * *